(12) United States Patent
Meng et al.

(10) Patent No.: US 11,295,928 B2
(45) Date of Patent: Apr. 5, 2022

(54) MULTI-POLE DEFLECTOR FOR CHARGED PARTICLE BEAM AND CHARGED PARTICLE BEAM IMAGING APPARATUS

(71) Applicant: Zhongke Jingyuan Electron Limited, Beijing (CN), Beijing (CN)

(72) Inventors: Qinglang Meng, Beijing (CN); Weiqiang Sun, Beijing (CN); Yan Zhao, Beijing (CN)

(73) Assignee: Zhongke Jingyuan Electron Limited, Beijing (CN), Beijing (CN)

( * ) Notice: Subject to any disclaimer, the term of this patent is extended or adjusted under 35 U.S.C. 154(b) by 0 days.

(21) Appl. No.: 17/006,106

(22) Filed: Aug. 28, 2020

(65) Prior Publication Data

US 2021/0066021 A1    Mar. 4, 2021

(30) Foreign Application Priority Data

Aug. 28, 2019 (CN) .......................... 201910803416.X

(51) Int. Cl.
*H01J 37/147* (2006.01)
*H01J 37/10* (2006.01)
(Continued)

(52) U.S. Cl.
CPC .......... *H01J 37/1472* (2013.01); *H01J 37/10* (2013.01); *H01J 37/21* (2013.01); *H01J 37/244* (2013.01);
(Continued)

(58) Field of Classification Search
CPC .......... H01J 37/10; H01J 37/244; H01J 37/28; H01J 37/1475; H01J 37/1472;
(Continued)

(56) References Cited

U.S. PATENT DOCUMENTS 6,268,606 B1    7/2001  Abe et al.
6,566,658 B1 *  5/2003  Okubo ................ H01J 37/1477
                                                250/292
(Continued)

FOREIGN PATENT DOCUMENTS

CN    2077591       5/1999
JP    08-17702      1/1996
(Continued)

OTHER PUBLICATIONS

First Chinese Office Action, issued in the corresponding Chinese patent application No. 201910803416 X, dated Jul. 21, 2021, 20 pages.

*Primary Examiner* — Jason L McCormack
(74) *Attorney, Agent, or Firm* — Hamre, Schumann, Mueller & Larson, P.C.

(57) ABSTRACT

The invention provides a multi-pole deflector for a charged particle beam, and a charged particle beam imaging apparatus. The deflector includes a plurality of poles, including at least two pairs of poles, each pole in each pair of poles including a main body constructed in the form of a circular arc-shaped section and a protrusion projecting from an radial inner side of the main body. respective two main bodies of each pair of poles are arranged concentrically and diametrically opposite, and the at least two pairs of poles at least partially encompass and delimit a through-hole thereamong, which opens axially and is configured to receive and to pass therethrough the charged particle beam; and the at least two pairs of poles cooperate to generate respective secondary deflection fields distributed within the through-hole and across an internal space defined within the through-hole, respectively, and the secondary deflection fields are synthesized by combination of vectors into a resultant deflection field of the deflector which is distributed within and across the through-hole and is configured to deflect the charged particle beam passing therethrough.

16 Claims, 7 Drawing Sheets

(51) Int. Cl.
*H01J 37/21* (2006.01)
*H01J 37/244* (2006.01)

(52) U.S. Cl.
CPC .................. *H01J 2237/0492* (2013.01); *H01J 2237/2448* (2013.01)

(58) Field of Classification Search
CPC ............... H01J 37/261; H01J 2237/057; H01J 2237/1516; H01J 2237/1534
USPC .............................. 250/306, 307, 311, 396 R
See application file for complete search history.

(56) References Cited

U.S. PATENT DOCUMENTS

| | | | | |
|---|---|---|---|---|
| 2006/0108524 | A1* | 5/2006 | Nagatomo | H01J 37/28 250/310 |
| 2017/0271124 | A1* | 9/2017 | Sasaki | H01J 37/244 |
| 2018/0005797 | A1* | 1/2018 | Kato | H01J 37/222 |
| 2018/0040452 | A1* | 2/2018 | Hatakeyama | H01J 37/147 |

FOREIGN PATENT DOCUMENTS

| | | |
|---|---|---|
| JP | 2014-192511 | 10/2014 |
| TW | 419734 | 1/2001 |

* cited by examiner

MULTI-POLE DEFLECTOR FOR CHARGED PARTICLE BEAM AND CHARGED PARTICLE BEAM IMAGING APPARATUS

CROSS-REFERENCE TO RELATED APPLICATION

The present disclosure claims the benefit of Chinese Patent Application Invention No. 201910803416.X filed on Aug. 28, 2019 in the State Intellectual Property Office of China, the whole disclosure of which is incorporated herein by reference.

BACKGROUND

Field

Embodiments of the present disclosure generally relate to the technical field of scan imaging technology with charged particle beam, and more particularly to a device configured to generate a deflection field (such as an electric field, a magnetic field, or the like) for deflection of a charged particle beam and further screening and detection of charged particles having certain respective specific energies and weights/masses, and in particular to a multi-pole deflector for a charged particle beam and a charged particle beam imaging apparatus.

Description of the Related Art

In recent years, charged particle beam scanning imaging apparatuses have been more and more widely used in semiconductor industry, for example, a critical dimension scanning electron microscope (CD-SEM), which is often used to measure critical dimension(s) of patterns on one and the same production object during manufacturing of the chip, such as a semiconductor wafer, a mask, or the like, so as to implement an online monitoring of production processes. Electron beam defect detection apparatus is configured to perform an imaging detection of defects in microscopic patterns on a semiconductor silicon wafer and in turn to feed back the yield in processes of production and process development. A main principle of the imaging and detection apparatuses with the charged particle beam is to use the charged particle beam (such as high-energy electron beam, and the like) to bombard a bombardment region on a surface of an object to be detected or tested (e.g., a chip to be tested), so as to excite charged particles which may contain or carry a variety of physical and chemical information of a sample itself which is to be tested within in the bombardment region, such as secondary charged particles, back-scattered particles and the like; and then, these charged particles are collected, processed and imaged, and in turn to obtain a variety of information of the sample to be tested, such as topography, composition, feature distribution and the like.

In a charged-particle detection and imaging apparatus, deflectors may be one type of the key devices, having a primary functionality of deflecting charged particle beam to perform a scanning. Specifically, a reflector may for example be an electric deflector or a magnetic deflector, which deflects charged particles entering a deflection field generated by the deflector itself, depending on respective masses, moving directions, charges and the like of the charged particles.

In a relevant technical field, it is required urgently to obtain an improved multi-pole deflector which may achieve a compromise between a simplification in structural design (e.g., a minimum number of poles and a minimum number of feed ports or feed terminals required by the poles) and a uniformity of field distribution of a deflection field as obtained (especially a uniformity of field distribution of the deflection field in a paraxial region of an optical axis Z).

SUMMARY

The embodiments of the present disclosure have been made to overcome or alleviate at least one aspect of the above mentioned disadvantages and/or shortcomings in the prior art, by providing a multi-pole deflector for a charged particle beam and a charged particle beam imaging apparatus.

In order to achieve above objectives, following technical solutions are adopted in exemplary embodiments of the invention.

According to one aspect of embodiments of the disclosure, there is provided a multi-pole deflector for a charged particle beam, comprising at least two pairs of poles, each pole in each pair of poles comprising:

a main body constructed in the form of a circular arc-shaped section; and a protrusion projecting from an radial inner side of the main body, wherein respective two main bodies of each pair of poles are arranged concentrically with each other and diametrically opposite to each other, and the at least two pairs of poles at least partially encompass and delimit a through-hole thereamong, which opens axially and is configured to receive and to pass therethrough the charged particle beam; and wherein respective two poles in pairs of the at least two pairs of poles cooperate to generate respective secondary deflection fields distributed within the through-hole and across an internal space defined within the through-hole, respectively, and the secondary deflection fields are synthesized by combination of vectors into a resultant deflection field of the deflector which is distributed within and across the through-hole and is configured to deflect the charged particle beam passing therethrough.

According to an exemplary embodiment of the present disclosure, the deflector is a multi-pole electrostatic deflector, the at least two pairs of poles are at least two pairs of electrodes formed by a conductive material and configured to generate respective electric fields cooperatively when bias voltages are applied thereon respectively, and the respective electric fields are synthesized by combination of vectors into a resultant deflection electric field of the multi-pole electrostatic deflector; or the deflector is a multi-pole magnetic deflector, the at least two pairs of poles comprise at least two pairs of magnetic poles formed by a magnetic conductor material and having respective excitation coils which are attached onto respective radial sides of the at least two pairs of magnetic poles, and is configured to generate respective magnetic fields cooperatively when an excitation current flows through the excitation coils, and the respective magnetic fields are synthesized by combination of vectors into a resultant deflection magnetic field of the multi-pole magnetic deflector.

According to an exemplary embodiment of the present disclosure, the respective two main bodies of each pair of poles in the at least two pairs of poles extend across an equivalent radian and have a same shape, respectively, in a circumferential direction of the respective two main bodies, and have a same inner radius at respective radial inner sides and a same outer radius at respective radial outer sides; and respective main bodies of the at least two pairs of poles are spaced apart from one another angularly and circumferentially, and are arranged to be in rotational symmetry with reference to one another, and respective poles in each pair of poles have central symmetry with reference to each other.

According to an exemplary embodiment of the present disclosure, the respective main bodies of the at least two pairs of poles extend across an equivalent radian and have a same shape, respectively, in a same circumference defined collectively by the respective main bodies, and have a same inner radius at respective radial inner sides and a same outer radius at respective radial outer sides; and the respective main bodies of the at least two pairs of poles are spaced apart from one another angularly in the same circumference defined collectively by the respective main bodies.

According to an exemplary embodiment of the present disclosure, the respective main bodies of the at least two pairs of poles are arranged to space apart from one another at a same angle circumferentially.

According to an exemplary embodiment of the present disclosure, the at least two pairs of poles comprise just two pairs of poles alternately spaced apart from one another at an angle of 90°.

According to an exemplary embodiment of the present disclosure, respective protrusions of the at least two pairs of poles are shaped and dimensioned to minimize an off-axis aberration of the charged particle beam being incident on the deflector and entering and passing through the through-hole of the deflector.

According to an exemplary embodiment of the present disclosure, each of respective protrusions of each pair of poles extends circumferentially across an angle not exceeding a threshold angle range, and projects from respective radial inner side of respective main body at a distance not exceeding a threshold radial distance.

According to an exemplary embodiment of the present disclosure, the threshold angle range is 5° to 40° and the threshold radial distance is between 0.1 and 0.9 times of the respective inner radius at respective radial inner sides of the respective main bodies of each pair of poles.

According to an exemplary embodiment of the present disclosure, each of the respective protrusions of each pair of poles is shaped to be in the form of a boss which projects from the respective radial inner side of the respective main body of the respective pole and is provided with an arc-shaped concave top portion.

According to an exemplary embodiment of the present disclosure, each of the respective protrusions of each pair of poles is shaped to be in the form of one of a partial sphere, a partial cone and a partial pyramid projecting from the respective radial inner side of the respective main body of the respective pole and is provided with a convex top portion.

According to an exemplary embodiment of the present disclosure, each of the respective protrusions of each pair of poles is shaped to be in the form of one of a truncated frustum of a cone, a truncated spherical segment, a frustum, and a multi-stage stepped boss projecting from the respective radial inner side of the respective main body of the respective pole and is provided with a flat top portion.

According to an exemplary embodiment of the present disclosure, the threshold angle range for respective protrusions of each pair of poles is equal to a radian angle range occupied by each of a pair of imaginary protrusions used instead of the respective protrusions in the pair of poles, such that a pair of poles alternatively having the pair of imaginary protrusions, each of which is in the form of a boss projecting from the respective radial inner side of the respective main body and is provided with an arc-shaped concave top portion, generate an imaginary secondary deflection field equivalent to the secondary deflection field as generated practically by the pair of poles having the respective protrusions other than the pair of imaginary protrusions.

According to an exemplary embodiment of the present disclosure, the at least two pairs of poles are just two pairs of poles.

According to a second aspect of embodiments of the disclosure, there is provided a charged particle beam imaging apparatus comprising at least one pair of the deflectors as above, the charged particle beam imaging apparatus being configured to project the charged particle beam to a surface of a sample to be tested and in turn to excite and collect second charged particles therefrom for imaging, further comprising:

a charged particle source configured to emit the charged particle beam; and a secondary charged particle detector, which is located to be offset from an optical axis of the charged particle beam and between the charged particle source and the sample to be tested and is configured to collect and image the secondary charged particles generated by the charged particle beam projected to the sample to be tested;

wherein, the at least one pair of the deflectors are symmetrically arranged with respect to the optical axis of the charged particle beam, and are configured to deflect and project the charged particle beam to the surface of the sample to be tested in response to a scanning signal applied thereon.

According to an exemplary embodiment of the present disclosure, the charged particle beam imaging apparatus further comprises an objective lens which is disposed coaxially with the optical axis and is located downstream or upstream of the at least one pair of the deflectors, and is configured to focus the charged particle beam passing therethrough onto the surface of the sample to be tested.

According to an exemplary embodiment of the present disclosure, the charged particle beam imaging apparatus further comprises:

at least one focusing lens, which is arranged coaxially with the optical axis and between the charged particle source and the at least one pair of the deflectors, and is configured to pre-focus and collimate the charged particle beam; and a restricting stop, which is disposed between the at least one focusing lens and the at least one pair of the deflectors, and is configured to adjust at least one of shape and size of the charged particle beam.

BRIEF DESCRIPTION OF THE DRAWINGS

In order to more clearly illustrate technical solutions of the embodiments of the present disclosure, the drawings required to be used with the description of the embodiments of the present disclosure will be briefly described by way of example as below in which corresponding reference numerals denote corresponding components. It is apparent that the drawings in the following description are merely some embodiments of the present disclosure. For those skilled in the art, other drawings can be obtained according to these drawings without paying any creative efforts. The accompanying drawings are used to provide a further understanding of the technical solution of embodiments of the disclosure, and constitute a part of the specification, for cooperating with embodiments of the disclosure to explain the technical solution of the embodiments of the disclosure, rather than forming any restriction on the technical solution of the embodiments of the disclosure, wherein.

DETAILED DESCRIPTION

Figure 1:
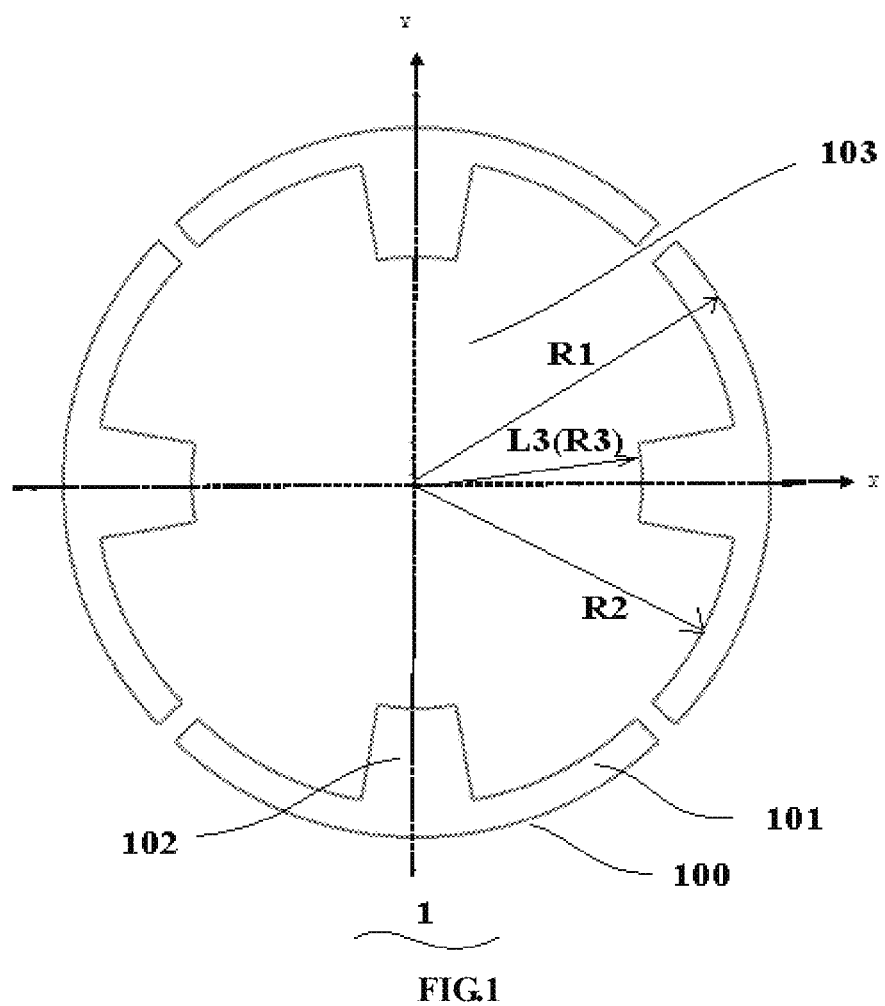
FIG. 1 illustrates a schematic structural view of a multi-pole deflector for a charged particle beam according to embodiments of the present disclosure, schematically showing that respective schematic structures of various poles are provided with respective protrusions protruding/projecting inwards from respective radial inner sides thereof, and respective schematic arrangements of various poles in which each protrusion is in the form of a boss which projects from the respective radial inner side of the respective pole and is provided with an arc-shaped concave top portion.

The technical solution of embodiments of the present disclosure will be further interpreted in detail with reference to the accompanying drawings. In the specification, same or similar reference numerals denote same or similar components. The following description of embodiments of the present disclosure with reference to the accompanying drawings is merely intended to interpret the general inventive concept of embodiments of the present disclosure, rather than being construed as a limitation of the present disclosure.

The accompanying drawings are used to illustrate the contents of embodiments of the present disclosure. Dimensions and shapes of the components in the drawings do not demonstrate true scales of components of a multi-pole deflector for a charged particle beam and a charged particle beam imaging apparatus.

In relevant technologies, for example, in the charged particle beam imaging apparatus, by way of example, a deflection of the charged particle beam is implemented by a bipolar type (i.e., a dual-pole type) deflection field which is generated by a deflector, e.g., a dual-pole type magnetic field or a dual-pole type electric field (i.e., a magnetic field formed by both N pole and S pole disposed opposite to each other; or an electric field formed by two electrodes of opposite electric polarities (i.e., a positive electrode and a negative electrode)). Accordingly, for example, the multi-pole deflector may be the magnetic deflector which is formed by magnetic poles which are provided with respective coils respectively to create opposite magnetic polarities thereon respectively so as to function as two types of poles disposed opposite to each other; or the multi-pole deflector may be the electric deflector which is formed by electrodes which have two opposite electric polarities respectively so as to function as two types of poles disposed opposite to each other; and as such, each arrangement as mentioned above, which generates the dual-pole type deflection field incurring deflection of charged particles in a fixed direction, constitutes a basic/fundamental unit of the multi-pole deflector.

One deflector having above dual-pole deflection field arrangement and functioning as a basic unit (thus it can be referred to as a dual-pole field deflector unit, hereinafter), may have following main characteristics: as far as specific structure and feeding of electrodes and magnetic poles are concerned respectively, there exist a symmetric plane and an anti-symmetric plane, comprising an optical axis Z orthogonal to the deflection field, respectively; and the electric field or the magnetic field generated thereby is perpendicular to the optical axis Z. In order to achieve deflected scanning at any angle on a two-dimensional surface, for example, at least two dual-pole field deflector units may be arranged to be in a 2N-pole structure, wherein N is the number of the dual-pole field deflector units (i.e., the number of the dual-pole field deflectors functioning as the basic units), and accordingly the multi-pole deflector having the 2N-pole structure comprising 2N poles. In a more specific example, two dual-pole field deflectors functioning as basic units are arranged collectively into a quadrupole structure. The multi-pole deflector having the 2N-pole structure for example generates N secondary deflection fields (also referred to as "deflection sub-fields") in a coplanar distribution, and then a resultant deflection field which is obtained by a synthesis of these secondary deflection fields by combination of vectors is essentially an equivalent dual-pole field, too, by way of example.

For a multi-pole deflector having at least two (e.g., a plurality of pairs of) dual-pole field deflectors, first of all, respective two opposite poles in each dual-pole field deflector are usually two poles in the form of two opposed plates parallel with each other, resulting in that a condition of edge distribution of a respective secondary deflection field generated thereby at the poles (especially at ends of the poles) significantly differs from a condition of central distribution of the respective secondary deflection field (e.g., field lines of the respective secondary deflection field are relatively uniformly distributed and are almost parallel with one another, centrally within the secondary deflection field), due to a distortion of field lines of the respective secondary deflection field at the poles (especially at ends of the poles) caused by an abrupt change in contour of the poles there, which fact is not conducive to realization of uniformity of an overall distribution of the respective secondary deflection field and a smooth transition of the condition of field distribution from inside of the secondary deflection field to a boundary region of the secondary deflection field. Furthermore, in the multi-pole deflector having at least two dual-pole field deflectors, in a condition of a relatively small number of the dual-pole field deflectors, although the multi-pole deflector has a relatively simple structure due to the relatively small number of poles and the relatively small number of feed ports required by the poles, the uniformity of the resultant deflection field in a paraxial region of the multi-pole magnetic deflector next to the optical axis Z is relatively poor, resulting in a relatively higher deflection aberration and an impact on quality of an off-axis beam spot; alternatively, in a condition of a relatively large number of the dual-pole field deflectors, due to the relatively large number of poles and the relatively large number of feed ports required by the poles, not only difficulties in the processing and assembly accuracy of the structure may be incurred, but also a need for an additional power supply will be created.

Therefore, in order to ensure that both the uniformity of the distribution of the field lines of the resultant deflection field in the distribution region of the deflection field which is defined by the poles of the multi-pole deflector (especially in the paraxial region of the multi-pole magnetic deflector next to the optical axis Z passing through the distribution region of the deflection field) for the passage of charged particles to be deflected therethrough, and the smoothness of field lines of the secondary deflection fields of the deflection field from the center to the edge of the deflection field may be achieved, with a structure of the multi-pole deflector simplified as much as possible (e.g., the minimum number of poles and the minimum number of feed ports), then, an improved multi-pole deflector is further proposed in the embodiment of the disclosure.

FIG. 1 illustrates a schematic structural view of a multi-pole deflector for a charged particle beam according to embodiments of the present disclosure, schematically showing that respective schematic structures of various poles are provided with respective protrusions protruding/projecting inwards from respective radial inner sides thereof, and respective schematic arrangements of various poles in which each protrusion is in the form of a boss which projects from the respective radial inner side of the respective pole and is provided with an arc-shaped concave top portion.

According to a general inventive concept of the embodiments of the disclosure, as illustrated in FIG. 1, in one aspect of the embodiments of the disclosure, a multi-pole deflector 1 for a charged particle beam is provided, which comprising at least two pairs of poles 100, each pole 100 in each pair of poles comprising: a main body 101 constructed in the form of a circular arc-shaped section; and a protrusion 102 projecting from an radial inner side of the main body 101. Respective two main bodies 101 of each pair of poles 100 are arranged concentrically with each other and diametrically opposite to each other, and the at least two pairs of poles 100 at least partially encompass and delimit a through-hole 103 thereamong (i.e., an axial through-hole 103), which opens axially and is configured to receive the charged particle beam to be deflected by the deflector 1 and to pass therethrough deflected charged particle beam; and poles in pairs of the at least two pairs of poles 100 of the deflector 1 cooperate to generate respective secondary deflection fields distributed within the through-hole and across an internal space defined within the through-hole, respectively, and the secondary deflection fields are synthesized by combination of vectors into a resultant deflection field of the deflector which is distributed within and across the through-hole 103 and is configured to deflect the charged particle beam passing therethrough.

As far as the multi-pole deflector 1 of the embodiments of the present disclosure is concerned, an operation principle on which the embodiments of the present disclosure are based is above all described, hereinafter.

In the embodiments of the present disclosure, as described above, on the one hand, respective two main bodies 101 of each pair of poles in the at least two pairs of poles 100, are each in the form of a circular arc-shaped section and are arranged concentrically with respect to the optical axis Z, and are arranged diametrically opposite; in other words, respective two main bodies 101 in each pole 100 are arranged concentrically in the circumferential direction, and are arranged to face towards each other in the diametrical direction. Such an arrangement in which respective two main bodies 101 of two poles in pair are disposed diametrically opposite to each other, in essence, facilitates that edge field lines of a respective secondary deflection field formed by respective two main bodies 101 in each pair of poles at ends of the two poles in pair extend substantially along the circumferential direction or in a direction close to the circumferential direction, such that the distribution of the edge field lines of these secondary deflection fields generated by pairs of poles in the deflector will in essence minimally influence the charged particle beam passing through the through-hole 103 which is at least partially encompassed and delimited by the poles 100 of the multi-pole deflector 1 and opens axially. As such, the influence of the distortion of the field lines of the respective secondary deflection fields of individual dual-pole deflectors in the multi-pole deflector 1 at edges as compared with the field lines at center thereof, on the charged particle beam passing through the axial through-hole 103 of the multi-pole deflector is minimized, with aforementioned arrangement in which respective two main bodies 101 of two poles 100 in pair are disposed opposite to each other in the circumferential direction.

In the embodiments of the present disclosure, on the other hand, as described above, each pole 100 is also provided with a respective protrusion 102 projecting radially inwards from the radial inner side of its main body 101. By providing the protrusion 102 projecting radially inward from the respective main body 101 of each pole, a difference between a spacing between respective central portions of respective two poles 100 in each pair of poles (such a spacing would have been relatively larger without the protrusion) and another spacing between respective end portions of respective two poles 100 in each pair of poles (such another spacing is relatively smaller, as compared with the distance between respective central portions without the protrusion) may be decreased substantially to an extent. In other words, a gradient of the spacing between respective two poles in each pair of poles in each dual-pole field deflector which changes from the central portions of the respective two poles towards the end portions thereof, will be decreased. As such, in the condition that the influence of the distortion of the field lines at the edges of the poles 100 on the charged particle beam is improved as described above, a trend that the spacing between respective two poles in each pair of poles 100 at the central portions is significantly different from that at the end portions is also alleviated, such that the significant change of the spacing between the respective two poles in each pair of poles 100 which is caused by the arrangement of the poles in the circumferential direction is compensated for, facilitating improving the uniformity of the resultant deflection field generated by the multi-pole deflector in a paraxial region next to the optical axis Z.

Therefore, it can be seen that, a main idea of the inventive concept of the embodiments of the present disclosure lies in that, the uniformity of the resultant deflection field generated by the multi-pole deflector within the through-hole 103 which is at least partially encompassed and delimited by the various poles 100 of the multi-pole deflector 1 (especially in the paraxial region next to the optical axis Z) is improved, by a cooperation between two aspects of settings, i.e., the arrangement in which respective two main bodies 101 of two poles 100 in each pair are disposed opposite to each other in the circumferential direction, and the respective protrusion 102 projecting radially inward from the respective main body 101 of each pole, especially using the respective protrusion 102 to compensate for a gradient of the spacing between respective two poles in each pair of poles in each dual-pole field deflector which spacing changes from the central portions of the respective two poles towards the end portions thereof, which gradient is caused by the arrangement in which respective two main bodies 101 of two poles 100 in each pair are disposed opposite to each other in the circumferential direction; and both shapes and arrangement of the various poles 100 (especially their respective main bodies 101) are relatively simple, facilitating ensuring both manufacturing simplicity and assembly accuracy.

In a further embodiment of the present disclosure, by way of example, as illustrated in FIG. 1, the respective two main bodies 101 of each pair of poles 100 in the at least two pairs of poles extend across an equivalent radian and have a same shape, respectively, in a circumferential direction of the respective two main bodies, and have a same inner radius at respective radial inner sides and a same outer radius at respective radial outer sides; and respective main bodies 101 of the at least two pairs of poles 100 are spaced apart from one another angularly and circumferentially, and are arranged to be in rotational symmetry with reference to one another, and respective poles in each pair of poles have central symmetry with reference to each other.

In a further embodiment of the present disclosure, by way of example, as illustrated in FIG. 1, the respective main bodies 101 of the at least two pairs of poles 100 extend across an equivalent radian and have a same shape, respectively, in a same circumference defined collectively by the respective main bodies, and have a same inner radius at respective radial inner sides and a same outer radius at respective radial outer sides; and the respective main bodies 101 of the at least two pairs of poles 100 are spaced apart from one another angularly in the same circumference of the respective main bodies.

With such a setting, the respective secondary deflection fields generated by all of the dual-pole field deflectors in the multi-pole deflector 1 have a same magnitude, respectively, facilitating both calculation and control of the resultant deflection field.

In a further embodiment of the present disclosure, by way of example, as illustrated in FIG. 1, the respective main bodies 101 of the at least two pairs of poles 100 are arranged to space apart from one another at a same angle circumferentially.

With such a setting, essentially, respective poles 100 of the multi-pole deflector 1, in particular the respective main body 101 in the respective poles 100, are arranged to spaced apart from one another at an equal angle in the circumferential direction, that is, arranged in a way of equally dividing the circumference, such that the respective secondary deflection fields generated by the dual-pole deflectors are respectively arranged in a roughly uniform distribution throughout the inside of the through hole 103 (especially in the paraxial region next to the optical axis Z) which is at least partially encompassed and delimited by the various poles 100 of the multi-pole deflector 1, further facilitating a better uniformity of the resultant deflection field.

In a further embodiment of the present disclosure, by way of example, as illustrated in FIG. 1, the at least two pairs of poles comprise just two pairs of poles alternately spaced apart from one another at an angle of 90°. In other words, the multi-pole deflector 1 comprises four poles 100 arranged orthogonally to one another, that is, two dual-pole field deflectors arranged orthogonal to each other. In other words, the multi-pole deflector is shaped into a quadrupole deflector.

With such a setting, the off-axis aberration introduced when the charged particle beam passes through the through-hole 103 of the multi-pole deflector 1 is reduced, and the multi-pole deflector is also realized with the minimum number of poles 100 and the minimum number of feed ports required by the poles 100, thereby simplifying the structure design and ensuring the simplicity of processing and manufacturing and the assembly accuracy.

According to an embodiment of the present disclosure, for example, respective protrusions 102 of the at least two pairs of poles are shaped and dimensioned to minimize an off-axis aberration of the charged particle beam being incident on the deflector 1 and entering and passing through the through-hole of the deflector.

Specifically, for example, each of the respective protrusions 102 of each pair of poles extends circumferentially across an angle which fails to exceed a predetermined angle range as a threshold angle range, and projects from respective radial inner side of respective main body at a distance which fails to exceed a predetermined radial distance as a threshold radial distance.

The shapes and dimensions of the protrusions 102, especially a radian angle A across which each of the protrusions 102 correspondingly spans in the circumferential direction, may be of vital importance to the uniformity of the resultant deflection field generated by the multi-pole deflector 1 in the paraxial region.

Specifically, in a condition that a radius R2 of each of the respective main bodies at respective radial inner side is given, and a ratio of a maximum length L3 of each of the protrusions 102 projecting from the inner side of respective main body 101 and in turn continuing extending radially inwards with reference to the radius R2 of each of the respective main bodies 101 is constant/fixed, the smaller the radian angle is, the smaller a circumferential range of the respective protrusion 102 is (i.e., the narrower the respective protrusion 102 in the circumferential direction is), and then the larger a degree of approximation how the shape and dimension of each pole 100 approximate to those of a pole having no respective protrusion 102 is, and the less a compensation effect of each protrusion on a change of the spacing between respective two poles in a respective pair of poles 100 due to the circumferential arrangement of the poles 100 is, accordingly. On the contrary, the bigger the radian angle is, the larger the circumferential range on the respective main body 101 of each of the respective poles 100 which is occupied by the respective protrusion 102 is (i.e., the wider the respective protrusion 102 in the circumferential direction is), and then the larger a degree of approximation how each pair of poles may be approximately equivalent to a pair of plate-like poles parallel to each other is, accordingly; as such, an effect of decreasing the influence of the distortion of the field lines of the respective secondary deflection fields of individual dual-pole deflectors in the multi-pole deflector 1 at edges as compared with the field lines at center thereof, on the charged particle beam passing through the axial through-hole 103 of the multi-pole deflector, by the arrangement in which respective two main bodies 101 of two poles 100 in each pair in the multi-pole deflector 1 are disposed opposite to each other in the circumferential direction, is less obvious.

In the multi-pole deflector, it is usually focused on the distribution of the deflection field thereof in the paraxial region next to the optical axis. It is indicated by a numerical simulation that, for a given radius R2 of each of the respective main bodies 101 at respective radial inner side thereof, a transverse field distribution which relatively approximates to a distribution of a dual-pole field may be obtained in a relatively larger range in the paraxial region correspondingly, by adopting a combinatorial optimization of both the maximum length L3 of each of the protrusions 102 projecting from the inner side of respective main body 101 and in turn continuing extending radially inwards and the radian A of each of the protrusions 102.

By way of example, the predetermined angle range of the radian angle A is 5° to 40° and the predetermined radial distance is between 0.1 and 0.9 times of the respective inner radius at respective radial inner sides of the respective main bodies of each pair of poles. As such, in case of such a dimensional setting, it is possible to obtain a maximum distribution of the resultant deflection field equivalent to a distribution of a dual-pole field in the paraxial region next to the optical axis Z, throughout the inside of the through-hole 103 of the quadrupole field deflector as illustrated in FIG. 1.

Further, according to an embodiment of the present disclosure, for example, as illustrated in FIG. 1, each of the respective protrusions 102 of each pair of poles is shaped to be in the form of a boss which projects from the respective radial inner side of the respective main body 101 of the respective pole 100 and is provided with an arc-shaped concave top portion. The maximum length L3 of each of the protrusions 102 of each pair of poles projecting from the inner side of respective main body 101 and in turn continuing extending radially inwards is a radius R3 at the arc-shaped concave top portion of the boss. Thus, for a given radius R2 of each of the respective main bodies 101 at respective radial inner side thereof, a transverse field distribution which relatively approximates to a distribution of a dual-pole field may be obtained in a relatively larger range in the paraxial region correspondingly, by adopting a combinatorial optimization of both the radius R3 at the arc-shaped concave top portion of the boss and the radian A of each of the protrusions 102.

Figure 6A:
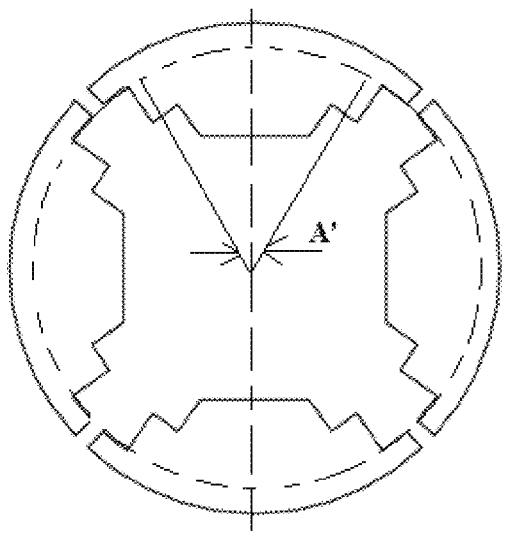
FIG. 6(a) illustrates a schematic structural view of an alternative multi-pole deflector for charged particles according to another embodiment of the present disclosure, schematically showing that each of the protrusions in the respective schematic structures of various poles is specifically in the form of a multi-stage stepped boss which projects from the respective radial inner side of a main body of the respective pole and is provided with a flat top portion.
Figure 6B:
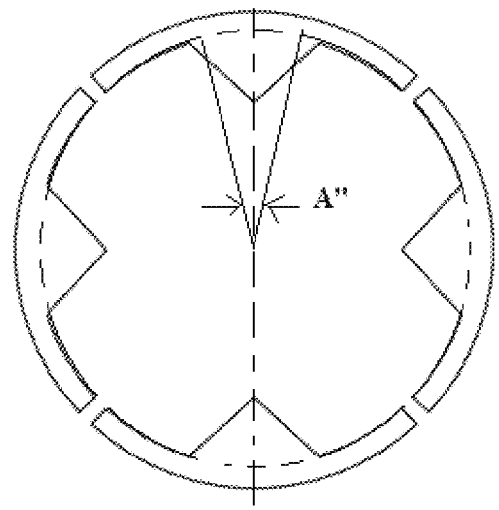
FIG. 6(b) illustrates a schematic structural view of an alternative multi-pole deflector for charged particles according to another embodiment of the present disclosure, schematically showing that each of the protrusions in the respective schematic structures of various poles is specifically in the form of a partial pyramid shape which projects from the respective radial inner side of a main body of the respective pole and is provided with a convex and sharpened top portion.
Figure 6C:
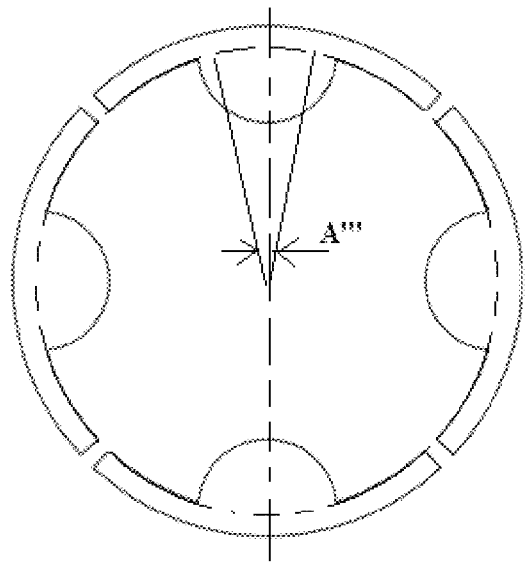
FIG. 6(c) illustrates a schematic structural view of an alternative multi-pole deflector for charged particles according to another embodiment of the present disclosure, schematically showing that each of the protrusions in the respective schematic structures of various poles is specifically in the form of a partial sphere shape which projects from the respective radial inner side of a main body of the respective pole and is provided with a convex and domed top portion.

According to alternative embodiments of the present disclosure, for example, as illustrated in FIG. 6(a), FIG. 6(b) and FIG. 6(c), other alternative forms of the projections 102 are shown. For example, FIG. 6(a) illustrates a schematic structural view of an alternative multi-pole deflector for charged particles according to another embodiment of the present disclosure, schematically showing that each of the protrusions in the respective schematic structures of various poles is specifically in the form of a multi-stage stepped boss which projects from the respective radial inner side of a main body of the respective pole and is provided with a flat top portion; FIG. 6(b) illustrates a schematic structural view of an alternative multi-pole deflector for charged particles according to another embodiment of the present disclosure, schematically showing that each of the protrusions in the respective schematic structures of various poles is specifically in the form of a partial pyramid shape which projects from the respective radial inner side of a main body of the respective pole and is provided with a convex and sharpened top portion; and FIG. 6(c) illustrates a schematic structural view of an alternative multi-pole deflector for charged particles according to another embodiment of the present disclosure, schematically showing that each of the protrusions in the respective schematic structures of various poles is specifically in the form of a partial sphere shape which projects from the respective radial inner side of a main body of the respective pole and is provided with a convex and domed top portion.

Specifically, for example, each of the respective protrusions of each pair of poles is shaped to be in the form of one of a partial sphere, a partial cone and a partial pyramid projecting from the respective radial inner side of the respective main body of the respective pole and is provided with a convex top portion; or alternatively, each of the respective protrusions of each pair of poles is shaped to be in the form of one of a truncated frustum of a cone, a truncated spherical segment, a frustum, and a multi-stage stepped boss projecting from the respective radial inner side of the respective main body of the respective pole and is provided with a flat top portion.

Accordingly, the predetermined angle range of the radian angle A', A" and A'" as illustrated in FIG. 6(a), FIG. 6(b) and FIG. 6(c) (as marked therein) for respective protrusions of each pair of poles is equal to a radian angle range occupied by each of a pair of imaginary protrusions used instead of the respective protrusions in the pair of poles, such that a pair of poles alternatively having the pair of imaginary protrusions, each of which is in the form of a boss projecting from the respective radial inner side of the respective main body and is provided with an arc-shaped concave top portion, generate an imaginary secondary deflection field equivalent to the secondary deflection field as generated practically by the pair of poles having the respective protrusions other than the pair of imaginary protrusions; in other words, the arc angle occupied by the boss is the equivalent radian angle of the equivalent arc boss calculated depending on respective secondary deflection field.

In an exemplary embodiment in the embodiments of the disclosure, by way of example, a multi-electrode electric deflector functions as the multi-pole deflector for charged particle beam.

Figure 2A:
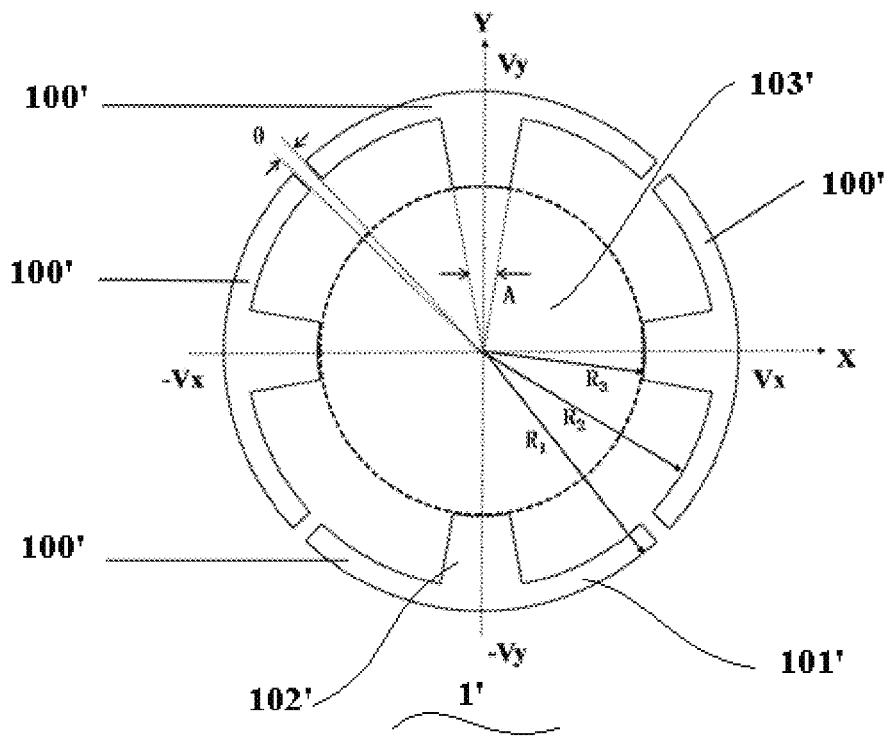
FIG. 2(a) illustrates a schematic structural view of a multi-pole electric deflector based on the schematic structure and arrangement of various poles as illustrated in FIG. 1.
Figure 2B:
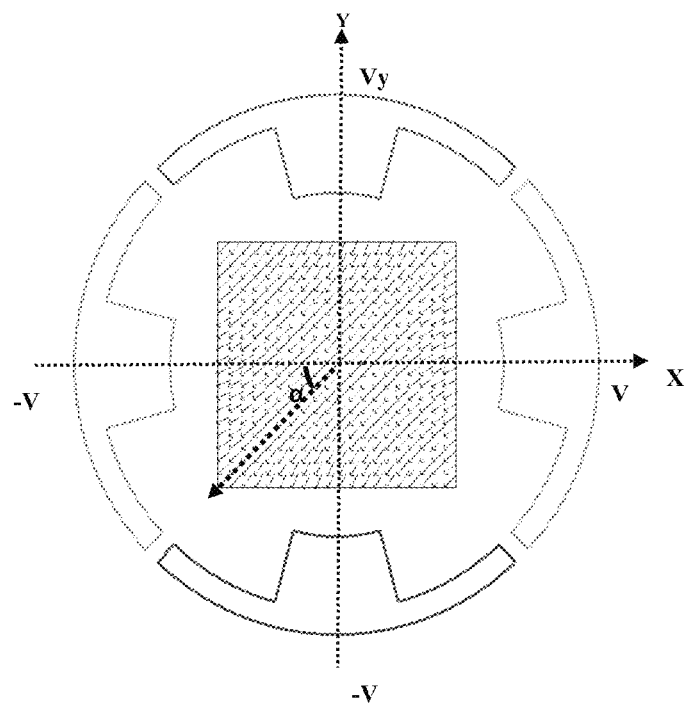
FIG. 2(b) illustrates a schematic diagram of distribution status of electric field lines in the multi-pole electric deflector in use as illustrated in FIG. 2(a)

FIG. 2(a) illustrates a schematic structural view of a multi-pole electric deflector based on the schematic structure and arrangement of various poles as illustrated in FIG. 1; FIG. 2(b) illustrates a schematic diagram of distribution status of electric field lines in the multi-pole electric deflector in use as illustrated in FIG. 2(a).

As illustrated in FIG. 2(a), the multi-electrode electric deflector 1' comprises: at least two pairs of electrodes 100' formed by a conductive material (such as metal or alloy material, graphite electrode material, or conductive oxide like ITO, or the like), each electrode 100' in each pair of electrodes comprising: a main body 101' constructed in the form of a circular arc-shaped section; and a protrusion 102' projecting from an radial inner side of the main body 101'. Respective two main bodies 101' of each pair of electrodes 100' are arranged concentrically with each other and diametrically opposite to each other, and the at least two pairs of electrodes 100' at least partially encompass and delimit a through-hole 103' thereamong (i.e., an axial through-hole 103'), which opens axially and is configured to receive the charged particle beam to be deflected and to pass therethrough deflected charged particle beam; and electrodes in pairs of the at least two pairs of electrodes 100' of the electric deflector 1' cooperate to generate respective secondary deflection fields distributed within the through-hole and across an internal space defined within the through-hole, respectively, and the secondary deflection fields are synthesized by combination of vectors into a resultant deflection electric field of the electric deflector which is distributed within and across the through-hole 103' and is configured to deflect the charged particle beam passing therethrough. In the multi-electrode electric deflector 1', each pair of electrodes (i.e. each dual-pole field electric deflector) generates a respective secondary electric field when the two opposite electrodes are respectively applied with respective external bias voltage(s), and the secondary electric field vectors of the pairs of electrodes are synthesized into the resultant deflection electric field of the multi-pole electric deflector 1'.

In the embodiments of the present disclosure, as described above, on the one hand, respective two main bodies 101' of each pair of electrodes in the at least two pairs of electrodes 100', are each in the form of a circular arc-shaped section and are arranged concentrically with respect to the optical axis Z, and are arranged diametrically opposite; in other words, respective two main bodies 101' in each electrode 100' are arranged concentrically in the circumferential direction, and are arranged to face towards each other in the diametrical direction. Such an arrangement in which respective two main bodies 101' of two electrodes in pair are disposed diametrically opposite to each other, in essence, facilitates that edge field lines of a respective secondary deflection field formed by respective two main bodies 101' in each pair of electrodes at ends of the two electrodes in pair extend substantially along the circumferential direction or in a direction close to the circumferential direction, such that the distribution of the edge field lines of these secondary deflection fields generated by pairs of electrodes in the electric deflector will minimally influence the charged particle beam passing through the through-hole 103' which is at least partially encompassed and delimited by the electrodes 100' of the multi-electrode electric deflector 1' and opens axially. As such, the influence of the distortion of the field lines of the respective secondary deflection fields of individual dual-electrode electric deflectors in the multi-electrode electric deflector 1' at edges as compared with the field lines at center thereof, on the charged particle beam passing through the axial through-hole 103' of the multi-electrode electric deflector is minimized, with aforementioned arrangement in which respective two main bodies 101' of two electrodes 100' in pair are disposed opposite to each other in the circumferential direction.

In the embodiments of the present disclosure, on the other hand, as described above, each electrode 100' is also provided with a respective protrusion 102' projecting radially inwards from the radial inner side of its main body 101'. By providing the protrusion 102' projecting radially inward from the respective main body 101' of each electrode, a difference between a spacing between respective central portions of respective two electrodes 100' in each pair of electrodes (such a spacing would have been relatively larger without the protrusion) and another spacing between respective end portions of respective two electrodes 100' in each pair of electrodes (such another spacing is relatively smaller, as compared with the distance between respective central portions without the protrusion) may be decreased substantially to an extent. In other words, a gradient of the spacing between respective two electrodes in each pair of electrodes in each dual-electrode field electric deflector which changes from the central portions of the respective two electrodes towards the end portions thereof, will be decreased. As such, in the condition that the influence of the distortion of the field lines at the edges of the electrodes 100' on the charged particle beam is improved as described above, a trend that the spacing between respective two electrodes in each pair of electrodes 100' at the central portions is significantly different from that at the end portions is also alleviated, such that the significant change of the spacing between the respective two electrodes in each pair of electrodes 100' which is caused by the arrangement of the electrodes in the circumferential direction is compensated for, facilitating improving the uniformity of the resultant deflection electric field generate by the multi-electrode electric deflector in a paraxial region next to the optical axis Z.

Therefore, it can be seen that, a main idea of the inventive concept of the embodiments of the present disclosure lies in that, the uniformity of the resultant deflection electric field generated by the multi-electrode electric deflector within the through-hole 103' which is at least partially encompassed and delimited by the various electrodes 100' of the multi-electrode electric deflector 1' (especially in the paraxial region next to the optical axis Z) is improved, by a cooperation between two aspects of settings, i.e., the arrangement in which respective two main bodies 101' of two electrodes 100' in each pair are disposed opposite to each other in the circumferential direction, and the respective protrusion 102' projecting radially inward from the respective main body 101' of each electrode, especially using the respective protrusion 102' to compensate for a gradient of the spacing between respective two electrodes in each pair of electrodes in each dual-electrode field electric deflector which spacing changes from the central portions of the respective two electrodes towards the end portions thereof, which gradient is caused by the arrangement in which respective two main bodies 101' of two electrodes 100 in each pair are disposed opposite to each other in the circumferential direction; and both shapes and arrangement of the various electrodes 100' (especially their respective main bodies 101') are relatively simple, facilitating ensuring both manufacturing simplicity and assembly accuracy.

In a further embodiment of the present disclosure, by way of example, as illustrated in FIG. 2(a), the respective two main bodies 101' of each pair of electrodes 100' in the at least two pairs of electrodes extend across an equivalent radian and have a same shape, respectively, in a circumferential direction of the respective two main bodies, and have a same inner radius at respective radial inner sides and a same outer radius at respective radial outer sides; and respective main bodies 101' of the at least two pairs of electrodes 100' are spaced apart from one another angularly and circumferentially, and are arranged to be in rotational symmetry with reference to one another, and respective electrodes in each pair of electrodes have central symmetry with reference to each other.

In a further embodiment of the present disclosure, by way of example, as illustrated in FIG. 2(a), the respective main bodies 101' of the at least two pairs of electrodes 100' extend across an equivalent radian and have a same shape, respectively, in a same circumference defined collectively by the respective main bodies, and have a same inner radius at respective radial inner sides and a same outer radius at respective radial outer sides; and the respective main bodies 101' of the at least two pairs of electrodes 100' are spaced apart from one another angularly in the same circumference of the respective main bodies.

With such a setting, the respective secondary deflection fields generated by all of the dual-electrode field electric deflectors in the multi-electrode electric deflector 1' have a same magnitude, respectively, facilitating both calculation and control of the resultant deflection electric field.

In a further embodiment of the present disclosure, by way of example, as illustrated in FIG. 2(a), the respective main bodies 101' of the at least two pairs of electrodes 100' are arranged to space apart from one another at a same angle circumferentially.

With such a setting, essentially, respective electrodes 100' of the multi-electrode electric deflector 1', in particular the respective main body 101' in the respective electrodes 100', are arranged to spaced apart from one another at an equal angle in the circumferential direction, that is, arranged in a way of equally dividing the circumference, such that the respective secondary deflection fields generated by the dual-electrode electric deflectors are respectively arranged in a roughly uniform distribution throughout the inside of the through hole 103' (especially in the paraxial region next to the optical axis Z) which is at least partially encompassed and delimited by the various electrodes 100' of the multi-electrode electric deflector 1', further facilitating a better uniformity of the resultant deflection electric field.

In a further embodiment of the present disclosure, by way of example, as illustrated in FIG. 2(a), the at least two pairs of electrodes comprise just two pairs of electrodes alternately spaced apart from one another at an angle of 90°. In other words, the multi-electrode electric deflector 1' comprises four electrodes 100' arranged orthogonally to one another, that is, two dual-electrode field electric deflectors arranged orthogonal to each other. In other words, the multi-electrode electric deflector is shaped into a quadruple-electrode electric deflector.

With such a setting, the off-axis aberration introduced when the charged particle beam passes through the through-hole 103' of the multi-electrode electric deflector 1' is reduced, and the multi-electrode electric deflector is also realized with the minimum number of electrodes 100' and the minimum number of feed ports required by the electrodes 100', thereby simplifying the structure design and ensuring the simplicity of processing and manufacturing and the assembly accuracy.

According to an embodiment of the present disclosure, for example, respective protrusions 102' of the at least two pairs of electrodes are shaped and dimensioned to minimize an off-axis aberration of the charged particle beam being incident on the electric deflector 1' and entering and passing through the through-hole of the electric deflector.

Specifically, for example, each of the respective protrusions 102' of each pair of electrodes extends circumferentially across an angle which fails to exceed a predetermined angle range as a threshold angle range, and projects from respective radial inner side of respective main body at a distance which fails to exceed a predetermined radial distance as a threshold radial distance.

The shapes and dimensions of the protrusions 102', especially a radian angle A across which each of the protrusions 102' correspondingly spans in the circumferential direction, may be of vital importance to the uniformity of the resultant deflection electric field generated by the multi-electrode electric deflector 1' in the paraxial region.

Specifically, in a condition that a radius R2 of each of the respective main bodies at respective radial inner side is given, and a ratio of a maximum length L3 of each of the protrusions 102' projecting from the inner side of respective main body 101' and in turn continuing extending radially inwards with reference to the radius R2 of each of the respective main bodies 101' is constant/fixed, the smaller the radian angle is, the smaller a circumferential range of the respective protrusion 102' is (i.e., the narrower the respective protrusion 102' in the circumferential direction is), and then the larger a degree of approximation how the shape and dimension of each electrode 100' approximate to those of a electrode having no respective protrusion 102' is, and the less a compensation effect of each protrusion on a change of the spacing between respective two electrodes in a respective pair of electrodes 100' due to the circumferential arrangement of the electrodes 100' is, accordingly. On the contrary, the bigger the radian angle is, the larger the circumferential range on the respective main body 101' of each of the respective electrodes 100' which is occupied by the respective protrusion 102' is (i.e., the wider the respective protrusion 102' in the circumferential direction is), and then the larger a degree of approximation how each pair of electrodes may be approximately equivalent to a pair of plate-like electrodes parallel to each other is, accordingly; as such, an effect of decreasing the influence of the distortion of the field lines of the respective secondary deflection fields of individual dual-electrode electric deflectors in the multi-electrode electric deflector 1' at edges as compared with the field lines at center thereof, on the charged particle beam passing through the axial through-hole 103' of the multi-electrode electric deflector, by the arrangement in which respective two main bodies 101' of two electrodes 100' in each pair in the multi-electrode electric deflector 1' are disposed opposite to each other in the circumferential direction, is less obvious.

In the multi-electrode electric deflector, it is usually focused on the distribution of the deflection electric field thereof in the paraxial region next to the optical axis. It is indicated by a numerical simulation that, for a given radius R2 of each of the respective main bodies 101' at respective radial inner side thereof, a transverse field distribution which relatively approximates to a distribution of a dual-electrode field may be obtained in a relatively larger range in the paraxial region correspondingly, by adopting a combinatorial optimization of both the maximum length L3 of each of the protrusions 102' projecting from the inner side of respective main body 101' and in turn continuing extending radially inwards and the radian A of each of the protrusions 102'.

By way of example, the predetermined angle range of the radian angle A is 5° to 40° and the predetermined radial distance is between 0.1 and 0.9 times of the respective inner radius at respective radial inner sides of the respective main bodies of each pair of electrodes. As such, in case of such a dimensional setting, it is possible to obtain a maximum distribution of the resultant deflection electric field equivalent to a distribution of a dual-electrode field in the paraxial region next to the optical axis Z, throughout the inside of the through-hole 103' of the quadruple-electrode field electric deflector as illustrated in FIG. 2(b).

Further, according to an embodiment of the present disclosure, for example, as illustrated in FIG. 2(a), each of the respective protrusions 102' of each pair of electrodes is shaped to be in the form of a boss which projects from the respective radial inner side of the respective main body 101' of the respective electrode 100' and is provided with an arc-shaped concave top portion. The maximum length L3 of each of the protrusions 102' of each pair of electrodes projecting from the inner side of respective main body 101' and in turn continuing extending radially inwards is a radius R3 at the arc-shaped concave top portion of the boss. Thus, for a given radius R2 of each of the respective main bodies 101' at respective radial inner side thereof, a transverse field distribution which relatively approximates to a distribution of a dual-electrode field may be obtained in a relatively larger range in the paraxial region correspondingly, by adopting a combinatorial optimization of both the radius R3 at the arc-shaped concave top portion of the boss and the radian A of each of the protrusions 102'.

Specifically, for example, an application example of the present disclosure is illustrated in FIG. 2(a), illustrating a quadruple-electrode electrostatic deflector. As far as the quadruple-electrode electrostatic deflector is concerned, in geometric structure thereof, for the optical axis (Z-axis), there are four plane symmetries each plane containing the Z axis; and in feeding distribution thereof, there are features of one plane symmetry and one plane anti-symmetry. Respective arc-shaped main bodies of the four electrodes 100' are shaped to be electrodes each being in the form of circular arc-shaped section having an outer radius R1 and an inner radius R2 which is less than R1, respectively, and are spaced apart from one another at a same gap occupying an equal radian circumferentially, i.e., with a gap angle θ between adjacent electrodes (i.e., an inter-polar gap angle θ). On this basis, on the radial inner side of the main body of each electrode, there is also provided with a boss-shaped structure having an arc-shaped concave top portion, which has its inner radius of R3 (less than R2) and its radian of A. Voltages Vy, -Vx, -Vy, Vx are applied on the electrodes 100' sequentially in the circumferential direction, respectively (i.e., in counter-clockwise direction from +Y direction, as illustrated); i.e., voltages Vy, -Vy and Vx, -Vx are applied in pairs on respective two electrodes in two pairs respectively as illustrated. The deflection electric field mainly along the radial direction is obtained in the paraxial area as in the cross section shown in the Figure, with an radian α formed between this direction and the X axis being determined by a calculation of arctan(Vy/Vx), as illustrated in FIG. 2(b) which shows a diagram of the distribution status of electric field lines of the resultant electric field in practical application of the multi-pole deflector.

It can be seen from FIG. 2(b) that the distribution status of the electric field lines in the paraxial region is substantially uniform, and the electric field lines are distributed depending on the shapes of the electrodes and the voltages applied on the electrodes. It is indicated by a numerical simulation that, for a given radius R2 of each of the respective main bodies 101, a transverse field distribution which relatively approximates to a distribution of a dual-pole field may be obtained in a relatively larger range in the paraxial region correspondingly, by adopting a combinatorial optimization of both the radius R3 at the arc-shaped concave top portion of the boss and the radian A of each of the protrusions 102.

Figure 3:
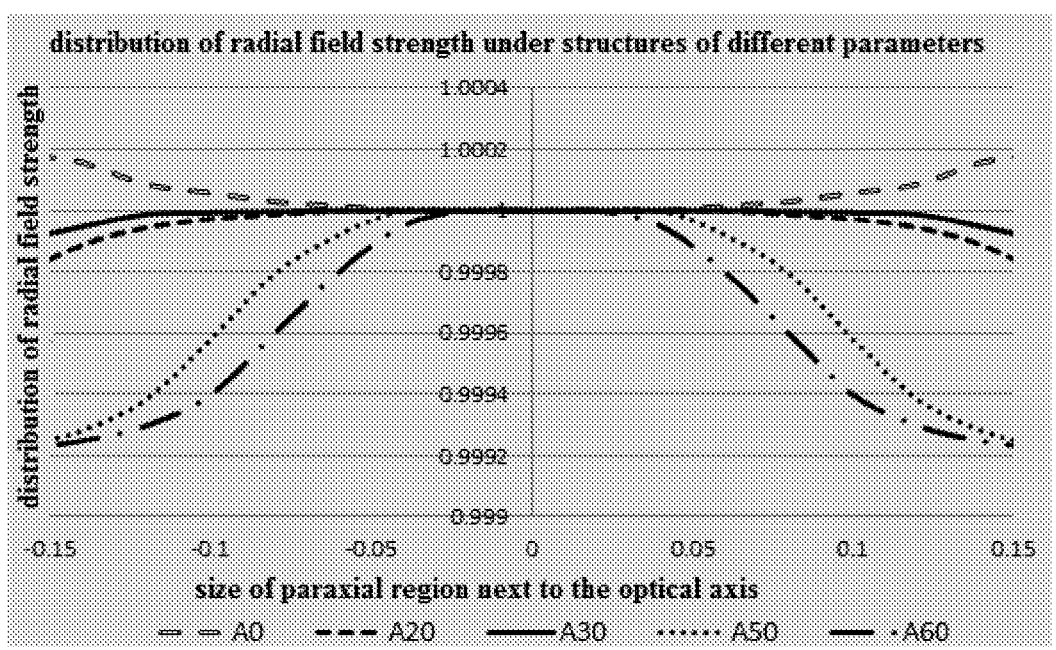
FIG. 3 illustrates a diagram of distribution status of electric field intensity of a radial deflection field falling within a paraxial region of the multi-pole electric deflector as illustrated in FIG. 2(a) on condition of different boss parameters (e.g., R3/R2=0.7), wherein a horizontal axis in FIG. 3 denotes a size (labeled by 'r') of the paraxial region and a vertical axis in FIG. 3 denotes a size (labeled by 'Er') of the radial field.

FIG. 3 illustrates a diagram of distribution status of electric field intensity of a radial deflection field falling within a paraxial region of the multi-pole electric deflector as illustrated in FIG. 2(a) on condition of different boss parameters (e.g., R3/R2=0.7), wherein a horizontal axis in FIG. 3 denotes a size (labeled by 'r') of the paraxial region and a vertical axis in FIG. 3 denotes a size (labeled by 'Er') of the radial field. The experimental data as practically detected may indicate that, in a condition of R3/R2=0.7, and in case that the angle A of the boss is equal to 30° (see Figure line A 30 as illustrated in FIG. 3), the uniformity of deflection of the electric field is better than that under other structural parameters, in the range of 300 um in the paraxial region. It can also be seen from FIG. 5 that, as compared with a multi-pole electric deflector structure without boss (i.e. an electrostatic deflector in relevant art, corresponding to the figure line of A0 in FIG. 3), the uniformity of deflection electric field of electrostatic deflectors as illustrated in FIG. 2(a) and FIG. 2(b) in the embodiment of the disclosure is better than that of quadruple-electrode electrostatic deflector structure without radial inner boss as in relevant art; especially, figure lines A20 and A30 indicate that, as compared with figure line A0, there is a relatively larger range of the figure lines A20 and A30 on the horizontal coordinate axis corresponding to a value approximately equal to the reference value 1 of the relative field strength on the vertical coordinate axis (a value of the field strength of the resultant deflection field at the optical axis is 1, which serves as the reference value, and vertical coordinate values of the figure lines are the relative ratio of specific field strengths at various point relative to the reference value 1, respectively). In case of a same deflection aberration, the electrostatic deflector of the embodiment of the present disclosure has a larger field of view, as compared with a quadruple-electrode electrostatic deflector without radial inner boss as in relevant art. And the embodiments of the present disclosure can be extended to more general application examples. For example, the outer radius R2 of the boss being in the range of 3~100 mm, the inner radius R3 of the boss being in the range of 0.1R2~0.9R2, and the radian value A of the boss in the range of 5°~40°, all fall into the scope of protection as claimed in the present disclosure.

According to alternative embodiments of the present disclosure, for example, as illustrated in FIG. 6(a), FIG. 6(b) and FIG. 6(c), other alternative forms of the projections 102' are shown. For example, FIG. 6(a) illustrates a schematic structural view of an alternative multi-electrode electric deflector for charged particles according to another embodiment of the present disclosure, schematically showing that each of the protrusions in the respective schematic structures of various electrodes is specifically in the form of a multi-stage stepped boss which projects from the respective radial inner side of a main body of the respective electrode and is provided with a flat top portion; FIG. 6(b) illustrates a schematic structural view of an alternative multi-electrode electric deflector for charged particles according to another embodiment of the present disclosure, schematically showing that each of the protrusions in the respective schematic structures of various electrodes is specifically in the form of a partial pyramid shape which projects from the respective radial inner side of a main body of the respective electrode and is provided with a convex and sharpened top portion; and FIG. 6(c) illustrates a schematic structural view of an alternative multi-electrode electric deflector for charged particles according to another embodiment of the present disclosure, schematically showing that each of the protrusions in the respective schematic structures of various electrodes is specifically in the form of a partial sphere shape which projects from the respective radial inner side of a main body of the respective electrode and is provided with a convex and domed top portion.

Specifically, for example, each of the respective protrusions of each pair of electrodes is shaped to be in the form of one of a partial sphere, a partial cone and a partial pyramid projecting from the respective radial inner side of the respective main body of the respective electrode and is provided with a convex top portion; or alternatively, each of the respective protrusions of each pair of electrodes is shaped to be in the form of one of a truncated frustum of a cone, a truncated spherical segment, a frustum, and a multi-stage stepped boss projecting from the respective radial inner side of the respective main body of the respective electrode and is provided with a flat top portion.

Accordingly, the predetermined angle range of the radian angle A', A" and A''' as illustrated in FIG. 6(a), FIG. 6(b) and FIG. 6(c) (as marked therein) for respective protrusions of each pair of electrodes is equal to a radian angle range occupied by each of a pair of imaginary protrusions used instead of the respective protrusions in the pair of electrodes, such that a pair of electrodes alternatively having the pair of imaginary protrusions, each of which is in the form of a boss projecting from the respective radial inner side of the respective main body and is provided with an arc-shaped concave top portion, generate an imaginary secondary deflection field equivalent to the secondary deflection field as generated practically by the pair of electrodes having the respective protrusions other than the pair of imaginary protrusions; in other words, the arc angle occupied by the boss is the equivalent radian angle of the equivalent arc boss calculated depending on respective secondary deflection field.

In another exemplary embodiment in the embodiments of the disclosure, by way of example, a multi-pole magnetic deflector functions as the multi-pole deflector for a charged particle beam.

Figure 4A:
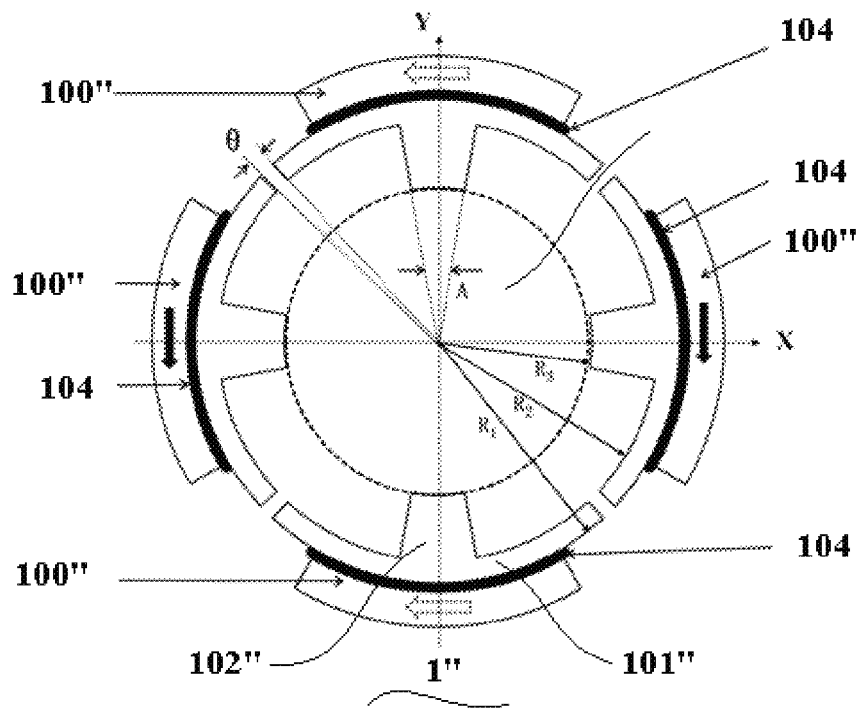
FIG. 4(a) shows a schematic structural view of a multi-pole magnetic deflector based on the schematic structure and arrangement of various poles as illustrated in FIG. 1.
Figure 4B:
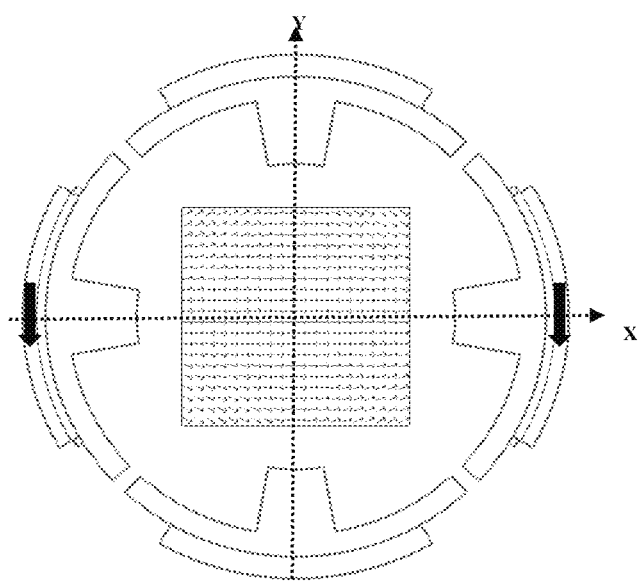
FIG. 4(b) illustrates a schematic diagram of distribution status of magnetic field in the multi-pole electric deflector in use as illustrated in FIG. 4(a)

FIG. 4(a) shows a schematic structural view of a multi-pole magnetic deflector based on the schematic structure and arrangement of various poles as illustrated in FIG. 1; FIG. 4(b) illustrates a schematic diagram of distribution status of magnetic field in the multi-pole electric deflector in use as illustrated in FIG. 4(a).

As illustrated in FIG. 4(a), the multi-magnetic pole magnetic deflector 1" comprises: at least two pairs of magnetic poles 100" formed by a magnetically permeable material (also referred to as "magnetic conductive material", for example a soft magnetic material, such as ferrosilicon, soft magnetic ferrite, or the like), each magnetic pole 100" in each pair of magnetic poles comprising: a main body 101" constructed in the form of a circular arc-shaped section; a protrusion 102" projecting from an radial inner side of the main body 101"; and an excitation coil 104 attached on a radial side (e.g., a radial outer side or the radial inner side) of the magnetic pole 100", with respective excitation current flowing in the excitation coil 104 in a same direction, as illustrated in FIG. 4(a), where solid line arrows therein indicating a front side flowing direction while dotted line arrows therein indicating a back side flowing direction. Respective two main bodies 101" of each pair of magnetic poles 100" are arranged concentrically with each other and diametrically opposite to each other, and the at least two pairs of magnetic poles 100" at least partially encompass and delimit a through-hole 103" thereamong (i.e., an axial through-hole 103"), which opens axially and is configured to receive the charged particle beam to be deflected and to pass therethrough deflected charged particle beam; and magnetic poles in pairs of the at least two pairs of magnetic poles 100" of the magnetic deflector 1" cooperate to generate respective secondary deflection fields distributed within the through-hole and across an internal space defined within the through-hole, respectively, and the secondary deflection fields are synthesized by combination of vectors into a resultant deflection magnetic field of the magnetic deflector which is distributed within and across the through-hole 103" and is configured to deflect the charged particle beam passing therethrough. In the multi-magnetic pole magnetic deflector 1", each pair of magnetic poles (i.e. each dual-pole field magnetic deflector) generates a respective secondary magnetic field when the excitation current passes through the respective excitation coil, and the secondary magnetic field vectors of the pairs of magnetic poles are synthesized into the resultant deflection magnetic field of the multi-pole magnetic deflector 1".

In the embodiments of the present disclosure, as described above, on the one hand, respective two main bodies 101" of each pair of magnetic poles in the at least two pairs of magnetic poles 100", are each in the form of a circular arc-shaped section and are arranged concentrically with respect to the optical axis Z, and are arranged diametrically opposite; in other words, respective two main bodies 101" in each magnetic pole 100" are arranged concentrically in the circumferential direction, and are arranged to face towards each other in the diametrical direction. Such an arrangement in which respective two main bodies 101" of two magnetic poles in pair are disposed diametrically opposite to each other, in essence, facilitates that edge field lines of a respective secondary deflection field formed by respective two main bodies 101" in each pair of magnetic poles at ends of the two magnetic poles in pair extend substantially along the circumferential direction or in a direction close to the circumferential direction, such that the distribution of the edge field lines of these secondary deflection fields generated by pairs of magnetic poles in the magnetic deflector will minimally influence the charged particle beam passing through the through-hole 103" which is at least partially encompassed and delimited by the magnetic poles 100" of the multi-magnetic pole magnetic deflector 1" and opens axially. As such, the influence of the distortion of the field lines of the respective secondary deflection fields of individual dual-magnetic pole magnetic deflectors in the multi-magnetic pole magnetic deflector 1" at edges as compared with the field lines at center thereof, on the charged particle beam passing through the axial through-hole 103" of the multi-magnetic pole magnetic deflector is minimized, with aforementioned arrangement in which respective two main bodies 101" of two magnetic poles 100" in pair are disposed opposite to each other in the circumferential direction.

In the embodiments of the present disclosure, on the other hand, as described above, each magnetic pole 100" is also provided with a respective protrusion 102" projecting radially inwards from the radial inner side of its main body 101". By providing the protrusion 102" projecting radially inward from the respective main body 101" of each magnetic pole, a difference between a spacing between respective central portions of respective two magnetic poles 100" in each pair of magnetic poles (such a spacing would have been relatively larger without the protrusion) and another spacing between respective end portions of respective two magnetic poles 100" in each pair of magnetic poles (such another spacing is relatively smaller, as compared with the distance between respective central portions without the protrusion) may be decreased substantially to an extent. In other words, a gradient of the spacing between respective two magnetic poles in each pair of magnetic poles in each dual-magnetic pole field magnetic deflector which changes from the central portions of the respective two magnetic poles towards the end portions thereof, will be decreased. As such, in the condition that the influence of the distortion of the field lines at the edges of the magnetic poles 100" on the charged particle beam is improved as described above, a trend that the spacing between respective two magnetic poles in each pair of magnetic poles 100" at the central portions is significantly different from that at the end portions is also alleviated, such that the significant change of the spacing between the respective two magnetic poles in each pair of magnetic poles 100" which is caused by the arrangement of the magnetic poles in the circumferential direction is compensated for, facilitating improving the uniformity of the resultant deflection magnetic field generate by the multi-magnetic pole magnetic deflector in a paraxial region next to the optical axis Z.

Therefore, it can be seen that, a main idea of the inventive concept of the embodiments of the present disclosure lies in that, the uniformity of the resultant deflection magnetic field generated by the multi-magnetic pole magnetic deflector within the through-hole 103" which is at least partially encompassed and delimited by the various magnetic poles 100" of the multi-magnetic pole magnetic deflector 1" (especially in the paraxial region next to the optical axis Z) is improved, by a cooperation between two aspects of settings, i.e., the arrangement in which respective two main bodies 101" of two magnetic poles 100" in each pair are disposed opposite to each other in the circumferential direction, and the respective protrusion 102" projecting radially inward from the respective main body 101" of each magnetic pole, especially using the respective protrusion 102" to compensate for a gradient of the spacing between respective two magnetic poles in each pair of magnetic poles in each dual-magnetic pole field magnetic deflector which spacing changes from the central portions of the respective two magnetic poles towards the end portions thereof, which gradient is caused by the arrangement in which respective two main bodies 101" of two magnetic poles 100" in each pair are disposed opposite to each other in the circumferential direction; and both shapes and arrangement of the various magnetic poles 100" (especially their respective main bodies 101") are relatively simple, facilitating ensuring both manufacturing simplicity and assembly accuracy.

In a further embodiment of the present disclosure, by way of example, as illustrated in FIG. 4(*a*), the respective two main bodies 101" of each pair of magnetic poles 100" in the at least two pairs of magnetic poles extend across an equivalent radian and have a same shape, respectively, in a circumferential direction of the respective two main bodies, and have a same inner radius at respective radial inner sides and a same outer radius at respective radial outer sides; and respective main bodies 101" of the at least two pairs of magnetic poles 100" are spaced apart from one another angularly and circumferentially, and are arranged to be in rotational symmetry with reference to one another, and respective magnetic poles in each pair of magnetic poles have central symmetry with reference to each other.

In a further embodiment of the present disclosure, by way of example, as illustrated in FIG. 4(*a*), the respective main bodies 101" of the at least two pairs of magnetic poles 100" extend across an equivalent radian and have a same shape, respectively, in a same circumference defined collectively by the respective main bodies, and have a same inner radius at respective radial inner sides and a same outer radius at respective radial outer sides; and the respective main bodies 101" of the at least two pairs of magnetic poles 100" are spaced apart from one another angularly in the same circumference of the respective main bodies.

With such a setting, the respective secondary deflection fields generated by all of the dual-magnetic pole field magnetic deflectors in the multi-magnetic pole magnetic deflector 1" have a same magnitude, respectively, facilitating both calculation and control of the resultant deflection magnetic field.

In a further embodiment of the present disclosure, by way of example, as illustrated in FIG. 4(*a*), the respective main bodies 101" of the at least two pairs of magnetic poles 100" are arranged to space apart from one another at a same angle circumferentially.

With such a setting, essentially, respective magnetic poles 100" of the multi-magnetic pole magnetic deflector 1", in particular the respective main body 101" in the respective magnetic poles 100", are arranged to spaced apart from one another at an equal angle in the circumferential direction, that is, arranged in a way of equally dividing the circumference, such that the respective secondary deflection fields generated by the dual-magnetic pole magnetic deflectors are respectively arranged in a roughly uniform distribution throughout the inside of the through hole 103" (especially in the paraxial region next to the optical axis Z) which is at least partially encompassed and delimited by the various magnetic poles 100" of the multi-magnetic pole magnetic deflector 1", further facilitating a better uniformity of the resultant deflection magnetic field.

In a further embodiment of the present disclosure, by way of example, as illustrated in FIG. 4(*a*), the at least two pairs of magnetic poles comprise just two pairs of magnetic poles alternately spaced apart from one another at an angle of 90°. In other words, the multi-magnetic pole magnetic deflector 1" comprises four magnetic poles 100" arranged orthogonally to one another, that is, two dual-magnetic pole field magnetic deflectors arranged orthogonal to each other. In other words, the multi-magnetic pole magnetic deflector is shaped into a quadruple-pole magnetic deflector.

With such a setting, the off-axis aberration introduced when the charged particle beam passes through the through-hole 103" of the multi-magnetic pole magnetic deflector 1" is reduced, and the multi-magnetic pole magnetic deflector is also realized with the minimum number of magnetic poles 100" and the minimum number of feed ports required by the magnetic poles 100", thereby simplifying the structure design and ensuring the simplicity of processing and manufacturing and the assembly accuracy.

According to an embodiment of the present disclosure, for example, respective protrusions 102" of the at least two pairs of magnetic poles are shaped and dimensioned to minimize an off-axis aberration of the charged particle beam being incident on the magnetic deflector 1" and entering and passing through the through-hole of the magnetic deflector.

Specifically, for example, each of the respective protrusions 102" of each pair of magnetic poles extends circumferentially across an angle which fails to exceed a predetermined angle range as a threshold angle range, and projects from respective radial inner side of respective main body at a distance which fails to exceed a predetermined radial distance as a threshold radial distance.

The shapes and dimensions of the protrusions 102", especially a radian angle A across which each of the protrusions 102" correspondingly spans in the circumferential direction, may be of vital importance to the uniformity of the resultant deflection magnetic field generated by the multi-magnetic pole magnetic deflector 1" in the paraxial region.

Specifically, in a condition that a radius R2 of each of the respective main bodies at respective radial inner side is given, and a ratio of a maximum length L3 of each of the protrusions 102" projecting from the inner side of respective main body 101" and in turn continuing extending radially inwards with reference to the radius R2 of each of the respective main bodies 101" is constant/fixed, the smaller the radian angle is, the smaller a circumferential range of the respective protrusion 102" is (i.e., the narrower the respective protrusion 102" in the circumferential direction is), and then the larger a degree of approximation how the shape and dimension of each magnetic pole 100" approximate to those of a magnetic pole having no respective protrusion 102" is, and the less a compensation effect of each protrusion on a change of the spacing between respective two magnetic poles in a respective pair of magnetic poles 100" due to the circumferential arrangement of the magnetic poles 100" is, accordingly. On the contrary, the bigger the radian angle is, the larger the circumferential range on the respective main body 101" of each of the respective magnetic poles 100" which is occupied by the respective protrusion 102" is (i.e., the wider the respective protrusion 102" in the circumferential direction is), and then the larger a degree of approximation how each pair of magnetic poles may be approximately equivalent to a pair of plate-like magnetic poles parallel to each other is, accordingly; as such, an effect of decreasing the influence of the distortion of the field lines of the respective secondary deflection fields of individual dual-magnetic pole magnetic deflectors in the multi-magnetic pole magnetic deflector 1" at edges as compared with the field lines at center thereof, on the charged particle beam passing through the axial through-hole 103" of the multi-magnetic pole magnetic deflector, by the arrangement in which respective two main bodies 101" of two magnetic poles 100" in each pair in the multi-magnetic pole magnetic deflector 1" are disposed opposite to each other in the circumferential direction, is less obvious.

In the multi-magnetic pole magnetic deflector, it is usually focused on the distribution of the deflection magnetic field thereof in the paraxial region next to the optical axis. It is indicated by a numerical simulation that, for a given radius R2 of each of the respective main bodies 101" at respective radial inner side thereof, a transverse field distribution which relatively approximates to a distribution of a dual-magnetic pole field may be obtained in a relatively larger range in the paraxial region correspondingly, by adopting a combinatorial optimization of both the maximum length L3 of each of the protrusions 102" projecting from the inner side of respective main body 101" and in turn continuing extending radially inwards and the radian A of each of the protrusions 102".

By way of example, the predetermined angle range of the radian angle A is 5° to 40° and the predetermined radial distance is between 0.1 and 0.9 times of the respective inner radius at respective radial inner sides of the respective main bodies of each pair of magnetic poles. As such, in case of such a dimensional setting, it is possible to obtain a maximum distribution of the resultant deflection magnetic field equivalent to a distribution of a dual-magnetic pole field in the paraxial region next to the optical axis Z, throughout the inside of the through-hole 103" of the quadruple-pole field magnetic deflector as illustrated in FIG. 4(*b*) which for example illustrates an example of distribution status of magnetic field in radial direction in a condition that merely a group of coils 104 on both left and right magnetic poles are excited.

Further, according to an embodiment of the present disclosure, for example, as illustrated in FIG. 4(*a*), each of the respective protrusions 102" of each pair of magnetic poles is shaped to be in the form of a boss which projects from the respective radial inner side of the respective main body 101" of the respective magnetic pole 100" and is provided with an arc-shaped concave top portion. The maximum length L3 of each of the protrusions 102" of each pair of magnetic poles projecting from the inner side of respective main body 101" and in turn continuing extending radially inwards is a radius R3 at the arc-shaped concave top portion of the boss. Thus, for a given radius R2 of each of the respective main bodies 101" at respective radial inner side thereof, a transverse field distribution which relatively approximates to a distribution of a dual-magnetic pole field may be obtained in a relatively larger range in the paraxial region correspondingly, by adopting a combinatorial optimization of both the radius R3 at the arc-shaped concave top portion of the boss and the radian A of each of the protrusions 102".

Specifically, for example, an application example of the present disclosure is illustrated in FIG. 4(*a*), illustrating a quadruple-pole magnetic deflector. The shape of the boss on a radial inner surface of each of the magnetic poles may still be described with parameters such as the outer radius R1 of the respective main body, the inner radius R2 of the respective main body, the inner radius R3 of the boss, and the radian angle A of the boss. With the excitation of a certain current in the excitation coils, the deflection magnetic field which distributed radially is obtained in the paraxial region in the cross section. As illustrated in FIG. 4(*b*), for example, it illustrates an example of distribution status of magnetic field in radial direction in a condition that merely a group of coils (606 and 608) are excited. As illustrated in FIG. 4(*b*), it shows a diagram of the distribution status of magnetic field lines of the resultant magnetic field in practical application of the multi-pole deflector.

It can be seen from FIG. 4(*b*) that the distribution status of the magnetic field lines in the paraxial region is substantially uniform, and the magnetic field lines are distributed depending on the shapes of the magnetic poles and the voltages applied on the magnetic poles. It is indicated by a numerical simulation that, for a given radius R2 of each of the respective main bodies 101, a transverse field distribution which relatively approximates to a distribution of a dual-pole field may be obtained in a relatively larger range in the paraxial region correspondingly, by adopting a combinatorial optimization of both the radius R3 at the arc-shaped concave top portion of the boss and the radian A of each of the protrusions 102.

Figure 5:
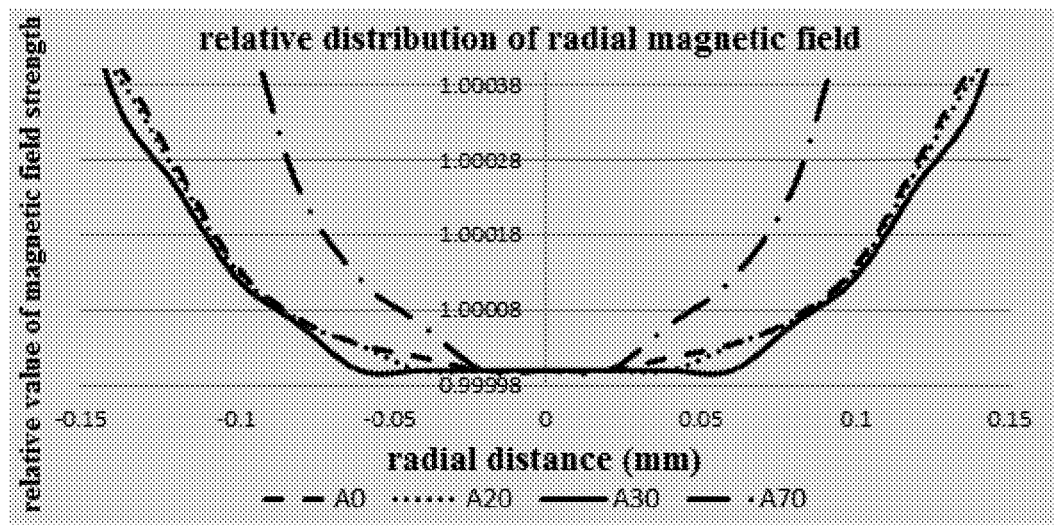
FIG. 5 illustrates a diagram of distribution status of electric field intensity of a radial deflection magnetic field falling within a paraxial region of the multi-pole magnetic deflector as illustrated in FIG. 4(a) on condition of different boss parameters (e.g., R3/R2=0.7), wherein a horizontal axis for the curves in FIG. 3 denotes a size (labeled by 'r') of the paraxial region and a vertical axis in FIG. 3 denotes a size (labeled by 'Br') of the radial magnetic field.

FIG. 5 illustrates a diagram of distribution status of magnetic field intensity of a radial deflection magnetic field falling within a paraxial region of the multi-pole magnetic deflector as illustrated in FIG. 4(a) on condition of different boss parameters (e.g., R3/R2=0.7), wherein a horizontal axis for the figure lines in FIG. 3 denotes a size (labeled by 'r') of the paraxial region and a vertical axis in FIG. 3 denotes a size (labeled by 'Br') of the radial magnetic field. The experimental data as practically detected may indicate that, in a condition of R3/R2=0.7, and in case that the angle A of the boss is equal to 30° (see Figure line A 30 as illustrated in FIG. 3), the uniformity of deflection of the magnetic field is better than that under other structural parameters, in the range of 300 um in the paraxial region. It can also be seen from FIG. 5 that, as compared with a multi-pole magnetic deflector structure without boss (i.e. an magnetic deflector in relevant art, corresponding to the figure line of A0 in FIG. 5), the uniformity of deflection magnetic field of magnetic deflectors as illustrated in FIG. 4(a) and FIG. 4(b) in the embodiment of the disclosure is better than that of quadruple-pole magnetic deflector structure without radial inner boss as in relevant art; especially, figure lines A20 and A30 indicate that, as compared with figure line A0, there is a relatively larger range of the figure lines A20 and A30 on the horizontal coordinate axis corresponding to a value approximately equal to the reference value 1 of the relative magnetic field strength/intensity on the vertical coordinate axis (a value of the magnetic field strength/intensity of the resultant deflection field at the optical axis is 1, which serves as the reference value, and vertical coordinate values of the figure lines are the relative ratio of specific field strengths at various point relative to the reference value 1, respectively). In case of a same deflection aberration, the magnetic deflector of the embodiment of the present disclosure has a larger field of view, as compared with a quadruple-pole magnetic deflector without radial inner boss as in relevant art. And the embodiments of the present disclosure can be extended to more general application examples. For example, the outer radius R2 of the boss being in the range of 3~100 mm, the inner radius R3 of the boss being in the range of 0.1R2~0.9R2, and the radian value A of the boss in the range of 5°~40°, all fall into the scope of protection as claimed in the present disclosure.

According to alternative embodiments of the present disclosure, for example, as illustrated in FIG. 6(a), FIG. 6(b) and FIG. 6(c), other alternative forms of the projections 102" are shown. For example, FIG. 6(a) illustrates a schematic structural view of an alternative multi-magnetic pole magnetic deflector for charged particles according to another embodiment of the present disclosure, schematically showing that each of the protrusions in the respective schematic structures of various magnetic poles is specifically in the form of a multi-stage stepped boss which projects from the respective radial inner side of a main body of the respective magnetic pole and is provided with a flat top portion; FIG. 6(b) illustrates a schematic structural view of an alternative multi-magnetic pole magnetic deflector for charged particles according to another embodiment of the present disclosure, schematically showing that each of the protrusions in the respective schematic structures of various magnetic poles is specifically in the form of a partial pyramid shape which projects from the respective radial inner side of a main body of the respective magnetic pole and is provided with a convex and sharpened top portion; and FIG. 6(c) illustrates a schematic structural view of an alternative multi-magnetic pole magnetic deflector for charged particles according to another embodiment of the present disclosure, schematically showing that each of the protrusions in the respective schematic structures of various magnetic poles is specifically in the form of a partial sphere shape which projects from the respective radial inner side of a main body of the respective magnetic pole and is provided with a convex and domed top portion.

Specifically, for example, each of the respective protrusions of each pair of magnetic poles is shaped to be in the form of one of a partial sphere, a partial cone and a partial pyramid projecting from the respective radial inner side of the respective main body of the respective magnetic pole and is provided with a convex top portion; or alternatively, each of the respective protrusions of each pair of magnetic poles is shaped to be in the form of one of a truncated frustum of a cone, a truncated spherical segment, a frustum, and a multi-stage stepped boss projecting from the respective radial inner side of the respective main body of the respective magnetic pole and is provided with a flat top portion.

Accordingly, the predetermined angle range of the radian angle A', A" and A''' as illustrated in FIG. 6(a), FIG. 6(b) and FIG. 6(c) (as marked therein) for respective protrusions of each pair of magnetic poles is equal to a radian angle range occupied by each of a pair of imaginary protrusions used instead of the respective protrusions in the pair of magnetic poles, such that a pair of magnetic poles alternatively having the pair of imaginary protrusions, each of which is in the form of a boss projecting from the respective radial inner side of the respective main body and is provided with an arc-shaped concave top portion, generate an imaginary secondary deflection field equivalent to the secondary deflection field as generated practically by the pair of magnetic poles having the respective protrusions other than the pair of imaginary protrusions; in other words, the arc angle occupied by the boss is the equivalent radian angle of the equivalent arc boss calculated depending on respective secondary deflection field.

Therefore, the embodiments of the disclosure have the following superior technical effect: in the embodiments of the disclosure, the uniformity of the resultant deflection field generated by the multi-pole deflector within the throughhole which is at least partially encompassed and delimited by the various poles of the multi-pole deflector (especially in the paraxial region next to the optical axis Z) is improved, by a cooperation between two aspects of settings, i.e., the arrangement in which respective two main bodies of two poles in each pair are disposed opposite to each other in the circumferential direction, and the respective protrusion projecting radially inward from the respective main body of each pole; and both shapes and arrangement of the various poles (especially their respective main bodies) are relatively simple, facilitating ensuring both manufacturing simplicity and assembly accuracy.

Figure 7:
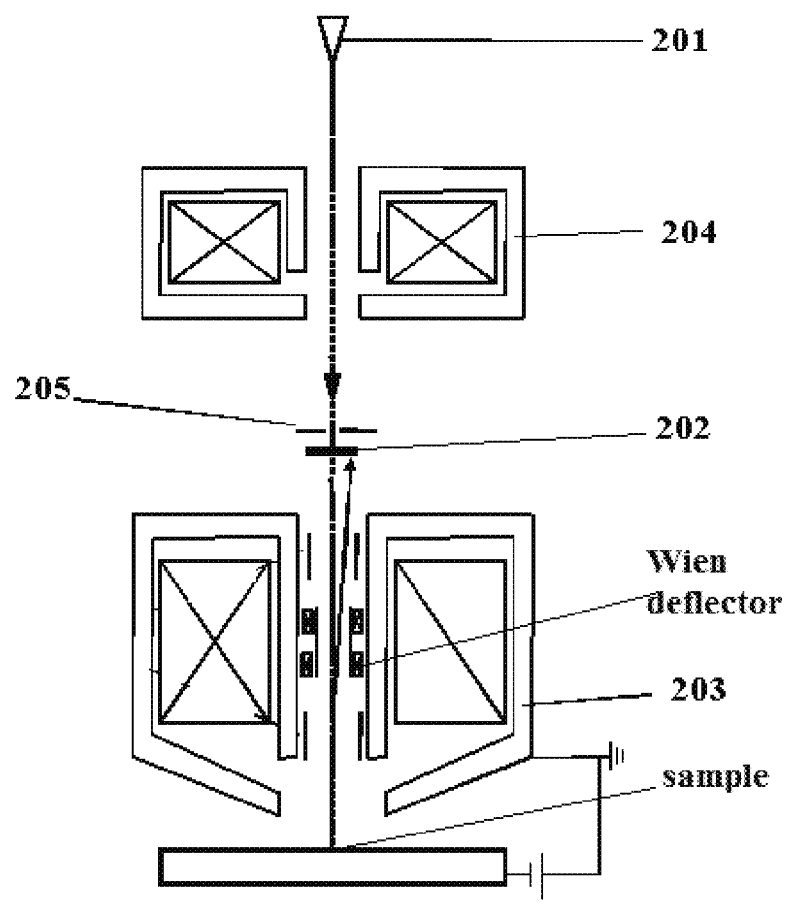
FIG. 7 illustrates a schematic structural view of a charged particle beam imaging apparatus according to embodiments of the present disclosure, in which the multi-pole deflector described above is used.

FIG. 7 illustrates a schematic structural view of a charged particle beam imaging apparatus according to embodiments of the present disclosure, in which the multi-pole deflector described above is used.

In another aspect of the embodiments of the present disclosure, as illustrated in FIG. 7, there is provided a charged particle beam imaging apparatus 2 comprising at least one pair of the aforementioned deflectors, the charged particle beam imaging apparatus 2 being configured to project the charged particle beam to a surface of a sample to be tested and in turn to excite and collect second charged particles therefrom for imaging, further comprising:

a charged particle source 201 configured to emit the charged particle beam; and a secondary charged particle detector 202, which is located to be offset from an optical axis of the charged particle beam and between the charged particle source and the sample to be tested and is configured to collect and image the secondary charged particles generated by the charged particle beam projected to the sample to be tested.

The at least one pair of the deflectors 1 are symmetrically arranged with respect to the optical axis Z of the charged particle beam, and are configured to deflect and project the charged particle beam to the surface of the sample to be tested in response to a scanning signal applied thereon (e.g., a grating scanning signal).

Since the at least one pair of deflectors 1 is contained in the charged particle beam imaging apparatus 2, the specific structural features of the at least one pair of deflectors 1 described above will not be repeatedly described here; and therefore, the charged particle beam imaging apparatus 2 also has the technical effect of the multi-pole deflector 1 described above, and will not be repeatedly described here.

In a further embodiment, for example, the charged particle beam imaging apparatus 2 further comprises an objective lens 203 which is disposed coaxially with the optical axis Z and is located downstream of the at least one pair of the deflectors 1 (e.g., as illustrated; or alternatively, located upstream of the at least one pair of the deflectors 1), and is configured to focus the charged particle beam passing therethrough onto the surface of the sample to be tested.

In a further embodiment, for example, the charged particle beam imaging apparatus 2 further comprises:

at least one focusing lens 204, which is arranged coaxially with the optical axis Z and between the charged particle source 201 and the at least one pair of the deflectors 1, and is configured to pre-focus and collimate the charged particle beam which is about to be incident to the multi-pole deflector; and a restricting stop 205, which is disposed between the at least one focusing lens 204 and the at least one pair of the deflectors 1, and is configured to adjust at least one of shape and size of the charged particle beam In a further embodiment, for example, the charged particle beam imaging apparatus 2 further comprises an aberration correction device, which is arranged coaxially with the optical axis and between the at least one pair of deflectors and the objective lens, and is configured to perform dynamic correction on a beam spot of the charged particle beam passing therethrough.

In a further embodiment, for example, as illustrated in FIG. 7, the charged particle beam imaging apparatus 22 further comprises a Wien deflector which is located in the objective lens 203 and is operable to deflect the secondary charged particles passing therethrough to a side of the optical axis Z such that the secondary charged particles are incident towards the secondary charged particle detector 202 for detection and imaging of the secondary charged particles.

The embodiments of the present disclosure are described in a progressive manner. Each embodiment focuses on the differences thereof as compared with other embodiments, and the same or similar parts of various embodiments can be referred to each other. In addition, according to the aforementioned embodiments of the present disclosure, it can be understood that any technical solution constructed through a combination of any two or more solutions may also fall within the scope of protection of the present disclosure.

The above are merely preferred embodiments of the invention and are not intended to limit the disclosure. Any modification, equivalent replacement, improvement, and the like made within the spirit and principles of the invention shall be contained in the protection scope of disclosure.

What is claimed is:

1. A multi-pole deflector for a charged particle beam, comprising at least two pairs of poles, each pole in each pair of poles comprising:

a main body constructed in the form of a circular arc-shaped section; and a protrusion projecting from an radial inner side of the main body, wherein respective two main bodies of each pair of poles are arranged concentrically with each other and diametrically opposite to each other, and the at least two pairs of poles at least partially encompass and delimit a through-hole thereamong, which opens axially and is configured to receive and to pass therethrough the charged particle beam;

wherein respective two poles in pairs of the at least two pairs of poles cooperate to generate respective secondary deflection fields distributed within the through-hole and across an internal space defined within the through-hole, respectively, and the secondary deflection fields are synthesized by combination of vectors into a resultant deflection field of the deflector which is distributed within and across the through-hole and is configured to deflect the charged particle beam passing therethrough, wherein the deflector is a multi-pole electrostatic deflector comprising merely at least two pairs of electrodes, which are formed by a conductive material and function as the at least two pairs of poles but are not multiplexed as magnetic poles, and configured to generate respective electric fields cooperatively when bias voltages are applied thereon respectively, and the respective electric fields are synthesized by combination of vectors into a resultant deflection electric field of the multi-pole electrostatic deflector, without generating magnetic field; or wherein the deflector is a multi-pole magnetic deflector comprising merely at least two pairs of magnetic poles, which are formed by a magnetic conductor material and have respective excitation coils attached onto respective radial sides of the at least two pairs of magnetic poles but are not multiplexed as electrodes, and configured to generate respective magnetic fields cooperatively when an excitation current flows through the excitation coils, and the respective magnetic fields are synthesized by combination of vectors into a resultant deflection magnetic field of the multi-pole magnetic deflector, without generating electric field, and wherein respective protrusions of the at least two pairs of poles are shaped and dimensioned to minimize an off-axis aberration of the charged particle beam being incident on the deflector and entering and passing through the through-hole of the deflector.

2. The deflector according to claim 1, wherein the respective two main bodies of each pair of poles in the at least two pairs of poles extend across an equivalent radian and have a same shape, respectively, in a circumferential direction of the respective two main bodies, and have a same inner radius at respective radial inner sides and a same outer radius at respective radial outer sides; and wherein respective main bodies of the at least two pairs of poles are spaced apart from one another angularly and circumferentially, and are arranged to be in rotational symmetry with reference to one another, and respective poles in each pair of poles have central symmetry with reference to each other.

3. The deflector according to claim 2, wherein the respective main bodies of the at least two pairs of poles extend across an equivalent radian and have a same shape, respectively, in a same circumference defined collectively by the respective main bodies, and have a same inner radius at respective radial inner sides and a same outer radius at respective radial outer sides; and wherein the respective main bodies of the at least two pairs of poles are spaced apart from one another angularly in the same circumference defined collectively by the respective main bodies.

4. The deflector according to claim 2, wherein the respective main bodies of the at least two pairs of poles are arranged to space apart from one another at a same angle circumferentially.

5. The deflector of claim 4, wherein the at least two pairs of poles comprise just two pairs of poles alternately spaced apart from one another at an angle of 90°.

6. The deflector according to claim 1, wherein each of respective protrusions of each pair of poles extends circumferentially across an angle not exceeding a threshold angle range, and projects from respective radial inner side of respective main body at a distance not exceeding a threshold radial distance.

7. The deflector according to claim 6, wherein the threshold angle range is 5° to 40° and the threshold radial distance is between 0.1 and 0.9 times of the respective inner radius at respective radial inner sides of the respective main bodies of each pair of poles.

8. The deflector according to claim 6, wherein each of the respective protrusions of each pair of poles is shaped to be in the form of a boss which projects from the respective radial inner side of the respective main body of the respective pole and is provided with an arc-shaped concave top portion.

9. The deflector according to claim 6, wherein each of the respective protrusions of each pair of poles is shaped to be in the form of one of a partial sphere, a partial cone and a partial pyramid projecting from the respective radial inner side of the respective main body of the respective pole and is provided with a convex top portion.

10. The deflector according to claim 6, wherein each of the respective protrusions of each pair of poles is shaped to be in the form of one of a truncated frustum of a cone, a truncated spherical segment, a frustum, and a multi-stage stepped boss projecting from the respective radial inner side of the respective main body of the respective pole and is provided with a flat top portion.

11. The deflector according to claim 9, wherein the threshold angle range for respective protrusions of each pair of poles is equal to a radian angle range occupied by each of a pair of imaginary protrusions used instead of the respective protrusions in the pair of poles, such that a pair of poles alternatively having the pair of imaginary protrusions, each of which is in the form of a boss projecting from the respective radial inner side of the respective main body and is provided with an arc-shaped concave top portion, generate an imaginary secondary deflection field equivalent to the secondary deflection field as generated practically by the pair of poles having the respective protrusions other than the pair of imaginary protrusions.

12. The deflector according to claim 10, wherein the threshold angle range for respective protrusions of each pair of poles is equal to a radian angle range occupied by each of a pair of imaginary protrusions used instead of the respective protrusions in the pair of poles, such that a pair of poles alternatively having the pair of imaginary protrusions, each of which is in the form of a boss projecting from the respective radial inner side of the respective main body and is provided with an arc-shaped concave top portion, generate an imaginary secondary deflection field equivalent to the secondary deflection field as generated practically by the pair of poles having the respective protrusions other than the pair of imaginary protrusions.

13. The deflector according to claim 1, wherein the at least two pairs of poles are just two pairs of poles.

14. A charged particle beam imaging apparatus comprising at least one pair of the deflectors according to claim 1, the charged particle beam imaging apparatus being configured to project the charged particle beam to a surface of a sample to be tested and in turn to excite and collect second charged particles therefrom for imaging, further comprising:
a charged particle source configured to emit the charged particle beam; and
a secondary charged particle detector, which is located to be offset from an optical axis of the charged particle beam and between the charged particle source and the sample to be tested and is configured to collect and image the secondary charged particles generated by the charged particle beam projected to the sample to be tested;
wherein, the at least one pair of the deflectors are symmetrically arranged with respect to the optical axis of the charged particle beam, and are configured to deflect and project the charged particle beam to the surface of the sample to be tested in response to a scanning signal applied thereon.

15. The charged particle beam imaging apparatus according to claim 14, further comprising an objective lens which is disposed coaxially with the optical axis and is located downstream or upstream of the at least one pair of the deflectors, and is configured to focus the charged particle beam passing therethrough onto the surface of the sample to be tested.

16. The charged particle beam imaging apparatus according to claim 15, further comprising:
at least one focusing lens, which is arranged coaxially with the optical axis and between the charged particle source and the at least one pair of the deflectors, and is configured to pre-focus and collimate the charged particle beam; and
a restricting stop, which is disposed between the at least one focusing lens and the at least one pair of the deflectors, and is configured to adjust at least one of shape and size of the charged particle beam.

* * * * *